United States Patent [19]
Omura et al.

[11] Patent Number: 6,049,109
[45] Date of Patent: *Apr. 11, 2000

[54] SILICON ON INSULATOR SEMICONDUCTOR DEVICE WITH INCREASED WITHSTAND VOLTAGE

[75] Inventors: Ichiro Omura, Yokohama; Akio Nakagawa, Hiratsuka, both of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/526,284

[22] Filed: Sep. 11, 1995

[30] Foreign Application Priority Data

Sep. 14, 1994 [JP] Japan ................................. 6-220636

[51] Int. Cl.[7] .................. H01L 27/01; H01L 29/861; H01L 29/74; H01L 31/075
[52] U.S. Cl. .................. 257/347; 257/104; 257/162; 257/343; 257/487; 257/603; 257/656
[58] Field of Search .................. 257/104, 106, 257/122, 141, 162, 168, 315, 343, 347, 409, 487, 488, 496, 603, 655, 656, 657

[56] References Cited

U.S. PATENT DOCUMENTS 5,343,067  8/1994  Nakagawa et al. .................... 257/487

FOREIGN PATENT DOCUMENTS

| 32 03 516 | 9/1982 | Germany | 257/314 |
| 3640363 | 8/1987 | Germany | 257/347 |
| 56-26429 | 3/1981 | Japan | 257/347 |
| 57-121220 | 7/1982 | Japan | 257/347 |
| 1-270312 | 10/1989 | Japan | 257/347 |

OTHER PUBLICATIONS

IEEE Transactions on Electron Devices "Breakdown Voltage Enhancement for Devices on Thin Silicon Layer/Silicon Dioxide Film", vol. 38, No. 7, Nakagawa, et al. Jul., 1991, pp. 1650–1654.
IEEE Electron Device Letters, vol. 15, No. 5, pp. 148–150, May 1994, I. J. Kim, et al., "Breakdown Voltage Improvement for Thin–Film SOI Power Mosfet's by a Buried Oxide Step Structure".

Primary Examiner—Steven H. Loke
Attorney, Agent, or Firm—Oblon, Spivak, McClelland, Maier & Neustadt, P.C.

[57] ABSTRACT

A power semiconductor device according to the present invention has an SOI substrate formed of a buried silicon oxide film having an uneven surface portion on the surface thereof and an n-type silicon active layer of low impurity concentration formed on the buried silicon oxide film. An n-type emitter layer and a p-type emitter layer are selectively formed in the surface area of the n-type silicon active layer. A cathode electrode and an anode electrode are respectively formed on the n-type emitter layer and p-type emitter layer. With the above structure, a power semiconductor device of high withstand voltage can be realized.

30 Claims, 16 Drawing Sheets

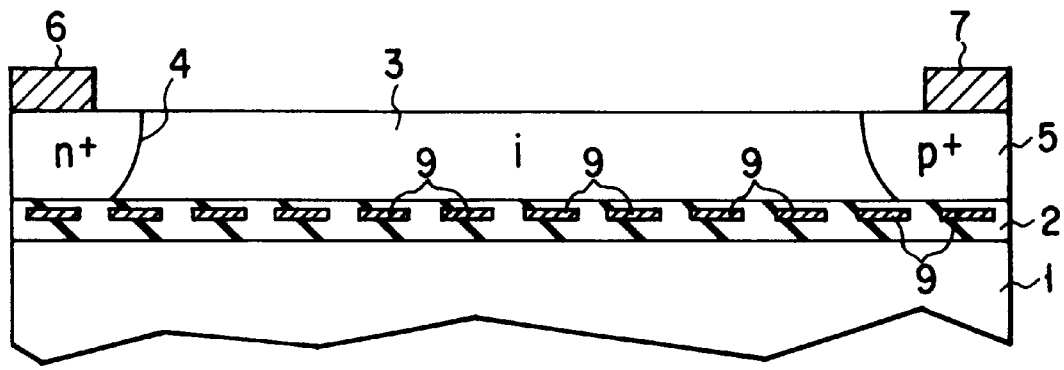
F I G. 13
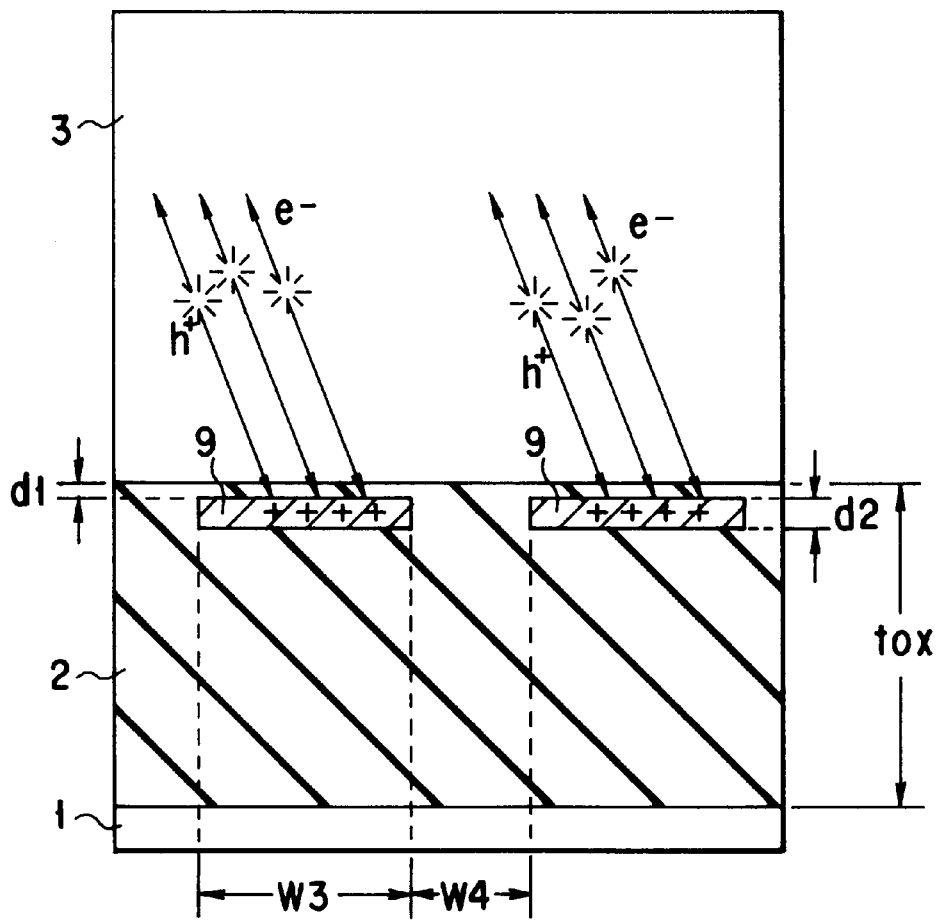
F I G. 14

| tox \ W4 | 0μm | 5μm | 2μm | 1μm |
|---|---|---|---|---|
| 2μm | 290 | 345 | 450 | 690 |
| 3μm | 370 | 475 | 630 | 1030 |
| 4μm | 450 | 605 | 840 | 1360 |

WITHSTAND VOLTAGE(V)

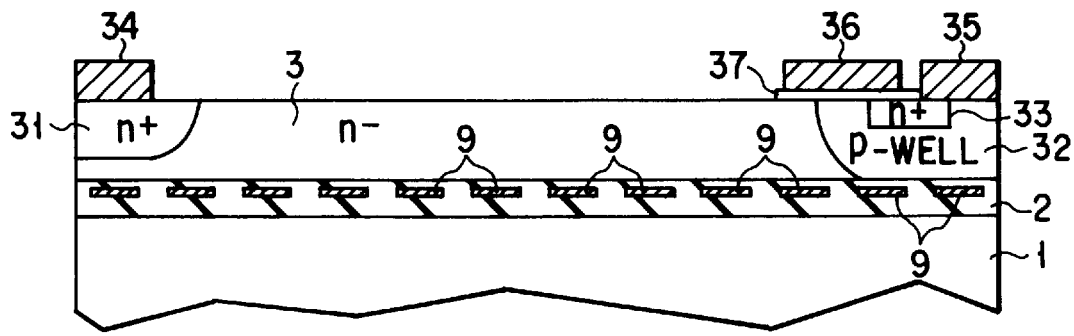
F I G. 30
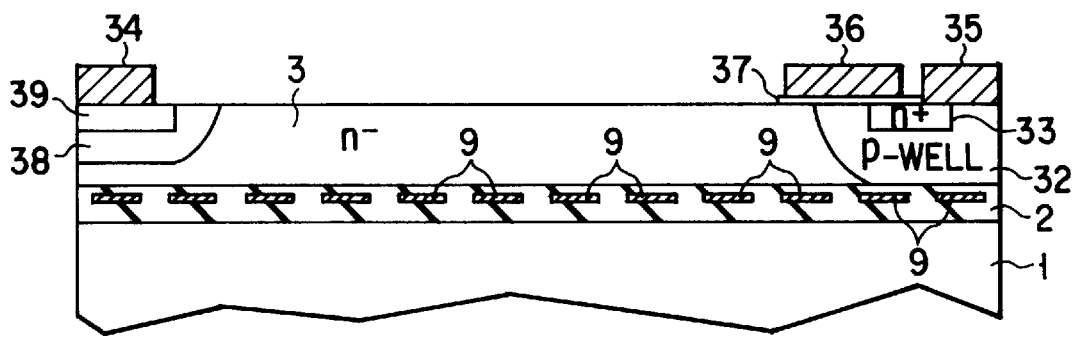
F I G. 31
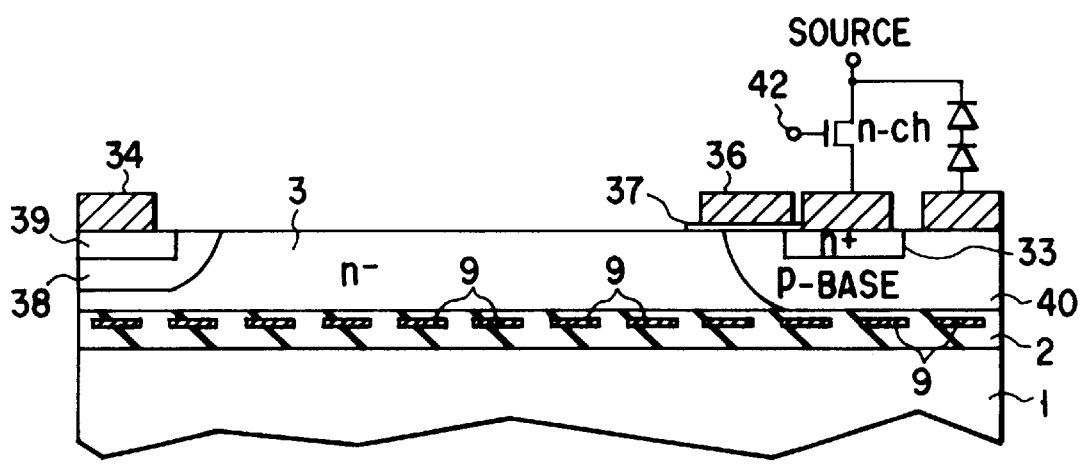
F I G. 32

SILICON ON INSULATOR SEMICONDUCTOR DEVICE WITH INCREASED WITHSTAND VOLTAGE

BACKGROUND OF THE INVENTION

1. Field of the Invention

The present invention relates to a power semiconductor device with SOI (Silicon On Insulator) structure.

2. Discussion of the Background

In recent years, integrated circuits (ICs) each having a large number of transistors and resistors which are connected to make an electric circuit and integrated on one chip are widely used in important portions of computers or communication devices. Among the above ICs, an IC of a type containing a semiconductor device with high withstand voltage (power semiconductor device) is called a power IC.

FIG. 1 is a cross sectional view showing the internal structure of a conventional power semiconductor device (pin diode) with SOI structure.

In FIG. 1, a reference numeral 91 denotes a semiconductor substrate, and an i-type semiconductor active layer (SOI semiconductor layer) 93 of low impurity concentration is formed above the semiconductor substrate 91 with an insulative film (SOI insulative film) 92 disposed therebetween.

An n-type emitter layer 94 of high impurity concentration and a p-type emitter layer 95 of high impurity concentration are formed by diffusion in the surface area of the i-type semiconductor active layer 93. A cathode electrode 96 is formed on the n-type emitter layer 94 and an anode electrode 97 is formed on the p-type emitter layer 95.

According to the power semiconductor device with the above structure, an applied voltage is shared (distributed) between the main body of the device and the insulative film 92 and thus a voltage applied to the main body of the device is lowered so that a high withstand voltage can be attained.

However, this type of power semiconductor device has the following problem. Since the voltage which the insulative film 92 can share is limited, it becomes difficult to attain a higher withstand voltage with the conventional structure.

SUMMARY OF THE INVENTION

Therefore, an object of the present invention is to provide a power semiconductor device with a withstand voltage higher than that of the conventional device.

According to a first aspect of the present invention, there is provided a power semiconductor device comprising a substrate; an insulative film formed on the substrate and having an uneven surface portion on the surface thereof; and a semiconductor film formed on the uneven surface portion of the insulative film; wherein the uneven surface portion causes carriers moving in the semiconductor film to be trapped.

According to a second aspect of the present invention, there is provided a power semiconductor device comprising a substrate; an insulative film formed on the substrate and having a plurality of chargeable floating electrodes buried therein; and a semiconductor film formed on the insulative film; wherein each of the floating electrodes causes charges generated in the semiconductor film to be injected therein.

According to a third aspect of the present invention, there is provided a power semiconductor device comprising a substrate; an insulative film formed on the substrate; and a semiconductor film formed on the insulative film and containing impurity; wherein the concentration profile of the impurity in the drift length direction in the drift region of the semiconductor film is defined in the form of letter "S".

According to the first aspect, since carriers moving in the semiconductor film are stored in the concave portions of the insulative film and the density of the electric field in the semiconductor film is reduced, the withstand voltage of a portion formed of the semiconductor film is enhanced.

According to the second aspect, since the density of the electric field in the semiconductor film is reduced by the charged electrode in the insulative film, the withstand voltage of a portion formed of the semiconductor film is enhanced.

Further, according to the study of the inventors of this application, it was proved that when the insulative film was thick (when the thickness of the insulative film was larger than the drift length of the semiconductor film) in a case where a substrate formed of the insulative film and the semiconductor film formed on the insulative film was used, a uniform electric field was created in the drift if the concentration file of impurity in the drift length direction in the drift region of the semiconductor film was defined in the form of letter "S", that is, there was no portion in which the electric field was partially increased and the withstand voltage was lowered, and as a result, the withstand voltage could be enhanced.

Therefore, according to the third aspect based on the above knowledge, the withstand voltage of a power semiconductor device can be enhanced even when a thick insulative film (SOI insulative film) is used.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 13 is a cross sectional view showing the internal structure of a power semiconductor device (pin diode) according to an eighth embodiment of the present invention;

FIG. 14 is a diagram showing the principle of the power semiconductor device shown in FIG. 13;

FIG. 30 is a cross sectional view showing the internal structure of a power semiconductor device (MOSFET) according to a nineteenth embodiment of the present invention;

FIG. 31 is a cross sectional view showing the internal structure of a power semiconductor device (IGBT) according to a twentieth embodiment of the present invention;

FIG. 32 is a cross sectional view showing the internal structure of a power semiconductor device (thyristor) according to a twenty-first embodiment of the present invention;

DETAILED DESCRIPTION OF THE PREFERRED EMBODIMENTS

There will now be described embodiments of the present invention with reference to the accompanying drawings.

Figure 2:
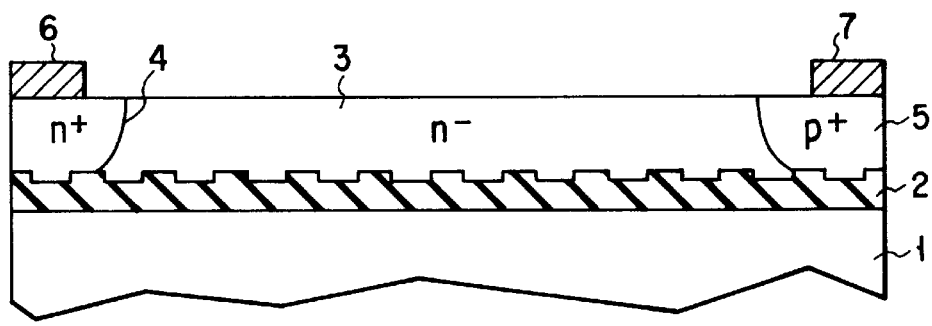
FIG. 2 is a cross sectional view showing the internal structure of a power semiconductor device (pin diode) according to a first embodiment of the present invention.

FIG. 2 is a cross sectional view showing the internal structure of a power semiconductor device (pin diode) according to a first embodiment of the present invention.

In the drawing, a reference numeral 1 denotes a grounded silicon substrate and a buried silicon oxide film (SOI insulative film) 2 having an uneven surface portion on the surface thereof is formed on the silicon substrate 1. An n-type silicon active layer (SOI semiconductor film) 3 of low impurity concentration is formed as an i-type layer (intrinsic layer) on the buried silicon oxide film 2. The buried silicon oxide film 2 and the n-type silicon active layer 3 are combined to form an SOI substrate.

An n-type emitter layer 4 of high impurity concentration and a p-type emitter layer 5 of high impurity concentration are formed by diffusion in the surface area of the n-type silicon active layer 3 and the p-type emitter layer 5, n-type silicon active layer 3 and n-type emitter layer 4 are combined to construct a pin diode.

A cathode electrode 6 is formed on the n-type emitter layer 4 and an anode electrode 7 is formed on the p-type emitter layer 5.

Figure 3:
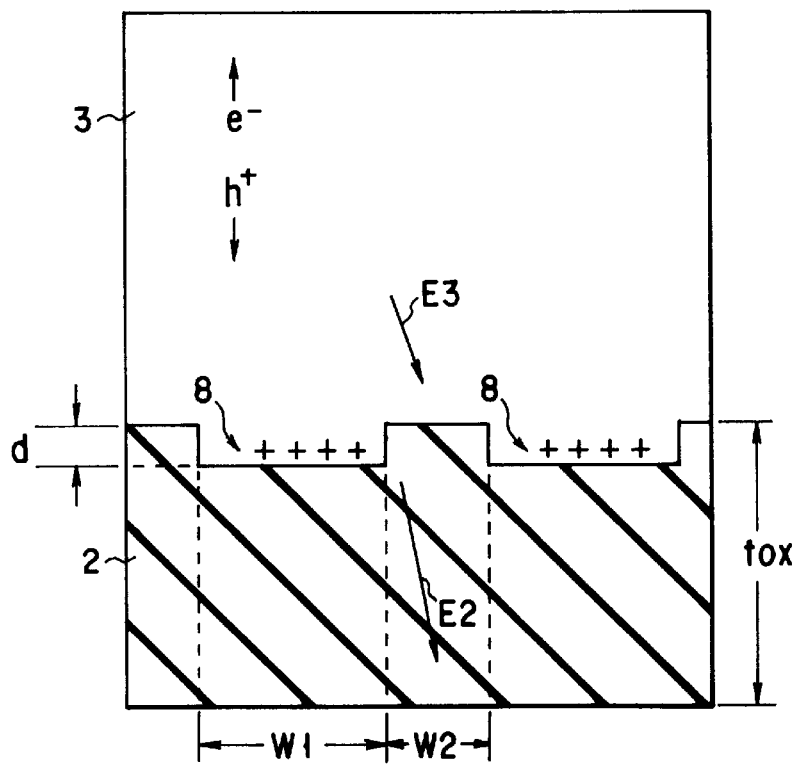
FIG. 3 is a diagram showing the principle of the power semiconductor device shown in FIG. 2.

When a positive voltage is applied to the power semiconductor device with the above structure via the cathode electrode 6 and anode electrode 7, holes $h^+$ among the carriers (electrons $e^-$ and holes $h^{30}$) in the device are trapped in the concave portions of the surface of the buried silicon oxide film 2 as shown in FIG. 3 since the silicon substrate 1 is grounded, and as a result, positive inversion layers 8 are formed in the concave portions on the surface of the buried silicon oxide film 2.

Since the above inversion layer 8 acts to reduce the strength of the electric field in the n-type silicon active layer 3, the electric field $E_3$ in the n-type silicon active layer 3 becomes weaker than the electric field $E_3$ without inversion layer 8. The same phenomenon occurs in the n-type emitter layer 4. Therefore, since the density of electric field in the device becomes weaker, the withstand voltage of the device can be increased accordingly in comparison with the conventional case.

As shown in FIG. 3, it is preferable that the depth d of the concave portion (the height of the convex portion) of the buried silicon oxide film 2 is set to be larger than 50 nm. By setting d to the above value, it becomes possible to effectively trap holes in the concave portions. Further, the thickness $t_{OX}$ of the buried silicon oxide film 2 is set to approx. 4 μm, for example. Further, it is preferable to set the lateral widths $W_1$ and $W_2$ of the concave portion and convex portion of the buried silicon oxide film 2 such that $W_1$, $W_2 < 3t_{OX}$. The thickness t of the buried silicon oxide film 2 is set to approx. 4 μm, for example.

The buried silicon oxide film 2 may be a PSG (Phospho-Silicate Glass) film, BPSG (Boron-Phospho-Silicate Glass) film or the like.

The reason why the density of the electric field in the n-type silicon active layer 3 is reduced is as follows:

If the dielectric factors of the buried silicon oxide film 2 and the n-type silicon active layer 3 are $\epsilon_2$ and $\epsilon_3$, the following equation can be obtained because of the continuity of the density of the electric field at the interface between the buried silicon oxide film 2 and the n-type silicon active layer 3 when no inversion layer 8 is formed.

$$\epsilon_3 \cdot E_3 = \epsilon_2 \cdot E_2 \tag{1}$$

If the amount of charges caused on the convex surface portions by the inversion layers 8 is Q (Q indicates an average on the interface between the buried silicon oxide film 2 and the n-type silicon active layer 3), the right side of the equation (1) is changed to ($\epsilon_2 \cdot E_2 - Q$).

Therefore, $E_3$ in the left side, that is, the electric field in the n-type silicon active layer 3 becomes weaker.

As described above, according to the first embodiment, the electric field in the silicon active layer can be weakened by using the buried silicon oxide film 2 having the uneven surface portion on the surface thereof, and a power semiconductor device having a withstand voltage higher than that of the conventional device can be attained.

Further, since the withstand voltage is enhanced, the impurity concentration of the n-type silicon active layer 3 can be increased and the ON-resistance thereof can be lowered.

Figure 1:
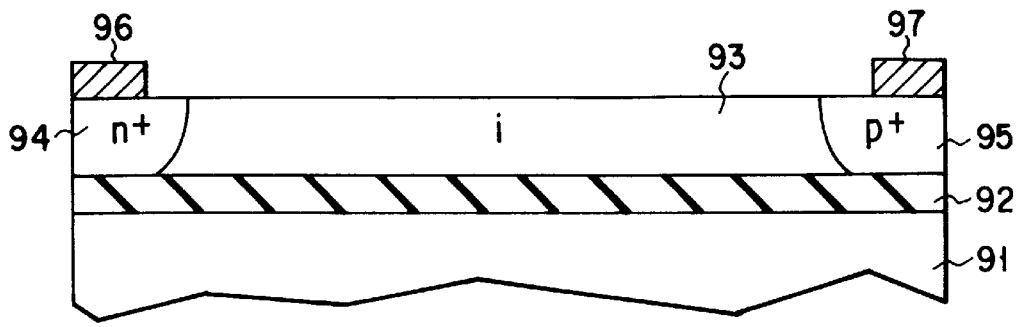
FIG. 1 is a cross sectional view showing the internal structure of a conventional power semiconductor device (pin diode)
Figure 4:
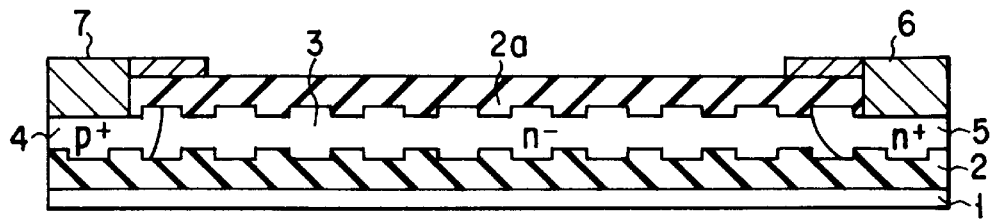
FIG. 4 is a cross sectional view showing the internal structure of a power semiconductor device (pin diode) according to a second embodiment of the present invention.

FIG. 4 is a cross sectional view showing the internal structure of a power semiconductor device (pin diode) according to a second embodiment of the present invention. In the following drawings, portions which are the same as or correspond to those which are shown in FIGS. 1 to 3 are denoted by the same reference numerals and the detail explanation therefor may be omitted (this also applies to the succeeding embodiments).

The power semiconductor device of the second embodiment is different from that of the first embodiment (FIG. 2) in that a buried silicon oxide layer 2a having an uneven surface portion on the surface thereof is also formed on the upper surface of the n-type silicon active layer 3. According to the second embodiment, the density of electric field in the upper portion of the n-type silicon active layer 3 can also be reduced and the withstand voltage can be further enhanced. In this example, electrons will be trapped in the concave portions of the buried silicon oxide film 2a.

Figure 5:
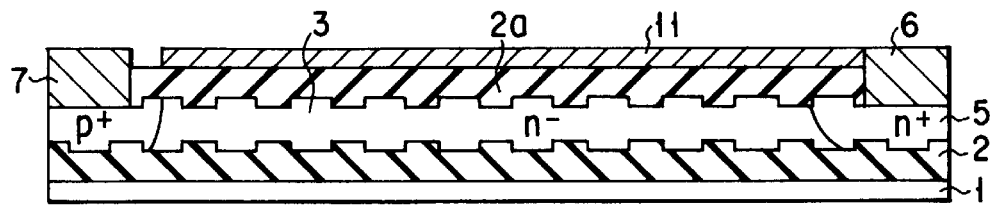
FIG. 5 is a cross sectional view showing the internal structure of a power semiconductor device (pin diode) according to a third embodiment of the present invention.

FIG. 5 is a cross sectional view showing the internal structure of a power semiconductor device (pin diode) according to a third embodiment of the present invention.

The power semiconductor device of the third embodiment is different from that of the second embodiment (FIG. 4) in that a field plate 11 is formed on the buried silicon oxide layer 2a. According to the third embodiment, the intense electric field created on the cathode electrode 6 side can be alleviated by the field plate 11 and the intense electric field created on the anode electrode 7 side by forming the field plate 11 can be alleviated by the buried silicon oxide film 2a.

Figure 6:
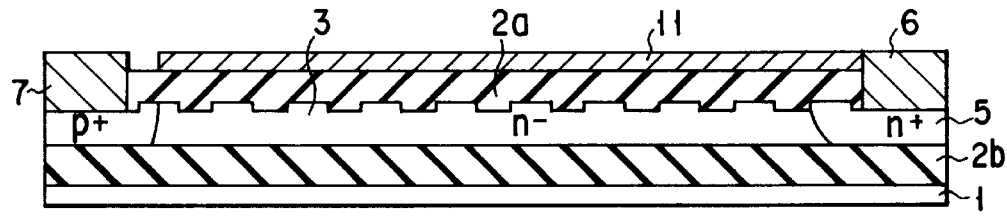
FIG. 6 is a cross sectional view showing the internal structure of a power semiconductor device (pin diode) according to a fourth embodiment of the present invention.

FIG. 6 is a cross sectional view showing the internal structure of a power semiconductor device (pin diode) according to a fourth embodiment of the present invention.

The power semiconductor device of the fourth embodiment is different from that of the second embodiment (FIG. 4) in that the surface of a buried silicon oxide film 2b on the silicon substrate 1 is made flat. If the buried silicon oxide layer 2b is made thick, a sufficiently high withstand voltage can be attained. In other words, if the buried silicon oxide film 2b is made thick, a sufficiently high withstand voltage can be attained only by use of the buried silicon oxide film 2a.

Figure 7:
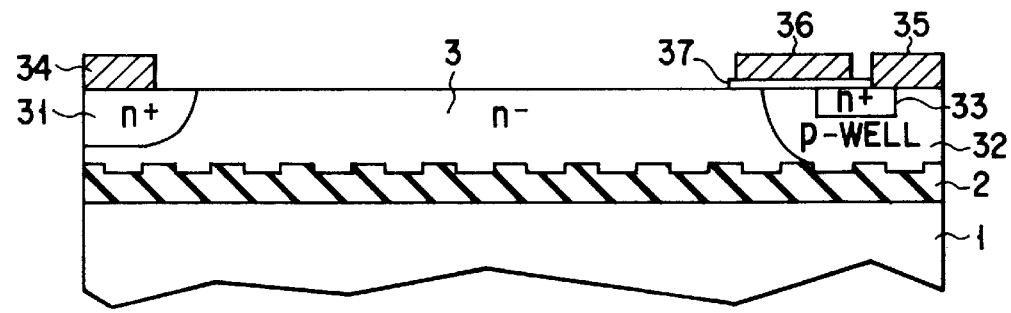
FIG. 7 is a cross sectional view showing the internal structure of a power semiconductor device (MOSFET) according to a fifth embodiment of the present invention.

FIG. 7 is a cross sectional view showing the internal structure of a power semiconductor device (MOSFET) according to a fifth embodiment of the present invention.

In the first embodiment (FIG. 2), the buried silicon oxide film according to the present invention is applied to the pin diode, but in the fifth embodiment, it is applied to a MOS field effect transistor (MOSFET). In this case, as shown in FIG. 7, an n-type drain layer 31 and a p-type well layer 32 are formed in the surface area of an n-type silicon active layer 3. Further, an n-type source layer 33 is formed in the surface area of the p-type well layer 32. Further, a drain electrode 34 is formed on the n-type drain layer 31, and a source electrode 35 is formed on the p-type well layer 32 and n-type source layer 33. A gate electrode 36 is formed on the n-type source layer 33, the p-type well layer 32, and n-type silicon active layer 3 via a gate oxide film 37.

With the above structure, like the case of the first embodiment, the density of the electric field in the device can be lowered and a MOSFET whose withstand voltage is higher than that of the conventional case can be obtained.

Figure 8:
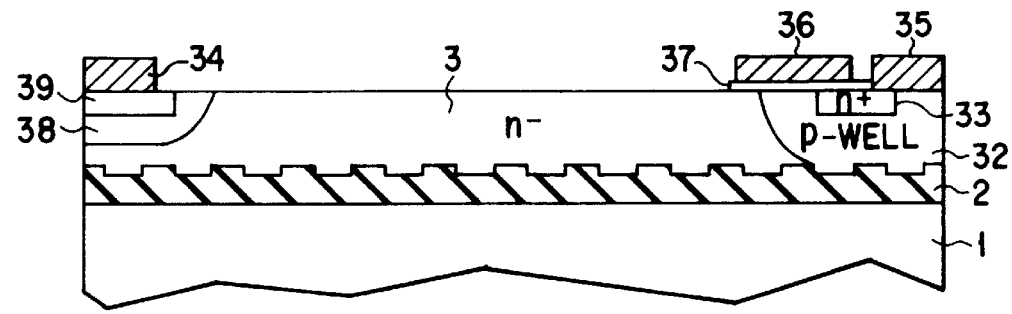
FIG. 8 is a cross sectional view showing the internal structure of a power semiconductor device (IGBT) according to a sixth embodiment of the present invention.

FIG. 8 is a cross sectional view showing the internal structure of a power semiconductor device (IGBT) according to a sixth embodiment of the present invention.

In the first embodiment (FIG. 2), the buried silicon oxide film according to the present invention is applied to the pin diode, but in the sixth embodiment, it is applied to an insulative gate type bipolar transistor (IGBT). In this case, as shown in FIG. 8, an n-type buffer layer 38 and a p-type well layer 32 are formed in the surface area of an n-type silicon active layer 3. Further, a p-type emitter layer 39 is formed in the surface area of the n-type buffer layer 38, and an n-type source layer 33 is formed in the surface area of the p-type well layer 32. Further, a drain electrode 34 is formed on the p-type emitter layer 39, and a source electrode 35 is formed on the p-type well layer 32 and n-type source layer 33. A gate electrode 36 is formed on the n-type source layer 33, the p-type well layer 32, and n-type silicon active layer 3 via a gate oxide film 37.

With the above structure, like the case of the first embodiment, the density of the electric field in the device can be lowered and an IGBT whose withstand voltage is higher than that of the conventional case can be obtained.

Figure 9:
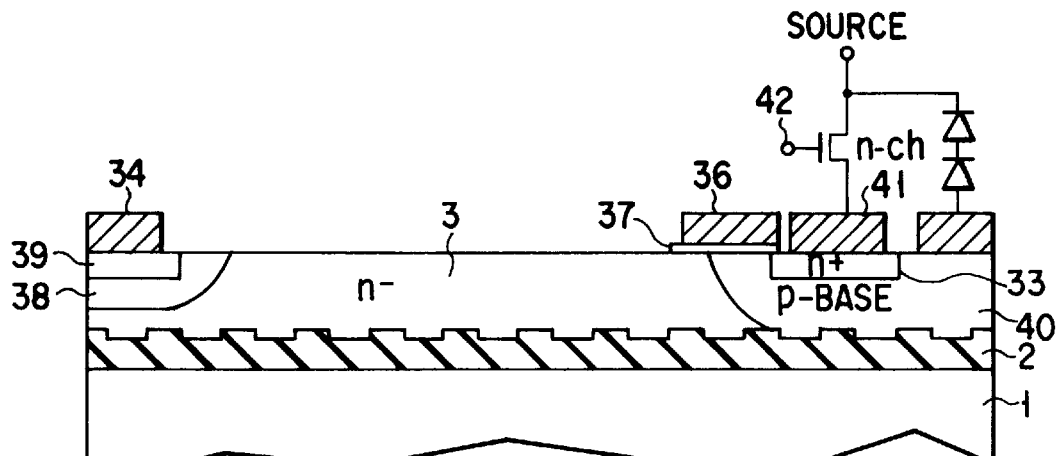
FIG. 9 is a cross sectional view showing the internal structure of a power semiconductor device (thyristor) according to a seventh embodiment of the present invention.

FIG. 9 is a cross sectional view showing the internal structure of a power semiconductor device (thyristor) according to a seventh embodiment of the present invention.

In the first embodiment (FIG. 2), the buried silicon oxide film according to the present invention is applied to the pin diode, but in the seventh embodiment, it is applied to a thyristor. In this case, as shown in FIG. 9, an n-type buffer layer 38 and a p-type base layer 40 are formed in the surface area of an n-type silicon active layer 3. Further, a p-type emitter layer 39 is formed in the surface area of the n-type buffer layer 38, and an n-type source layer 33 is formed in the surface area of the p-type base layer 40. Further, a drain electrode 34 is formed on the p-type emitter layer 39, and a source electrode 41 is formed on the p-type base layer 40 and n-type source layer 33. A gate electrode 36 is formed on the n-type source layer 33, the p-type base layer 40, and n-type silicon active layer 3 via a gate oxide film 37. In the driving operation, a switching circuit having a different gate 42 shown in FIG. 9 is connected to the source electrode 41, for example.

With the above structure, like the case of the first embodiment, the density of the electric field in the device can be lowered and a thyristor whose withstand voltage is higher than that of the conventional case can be obtained.

Figure 10:
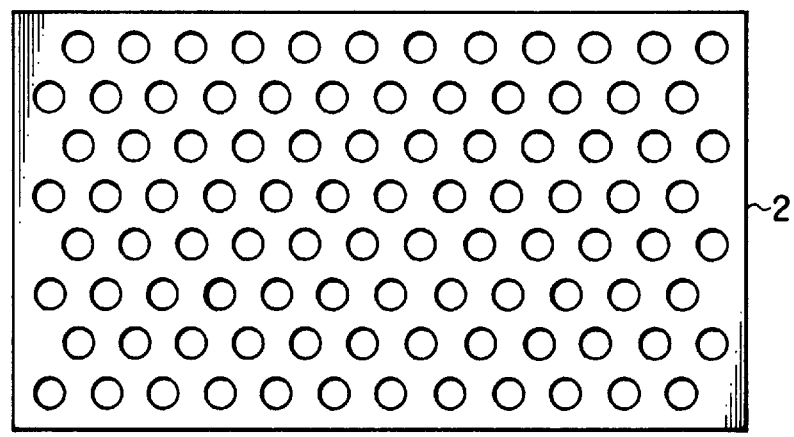
FIG. 10 is a plan view showing an uneven pattern of a buried silicon oxide film.
Figure 11:
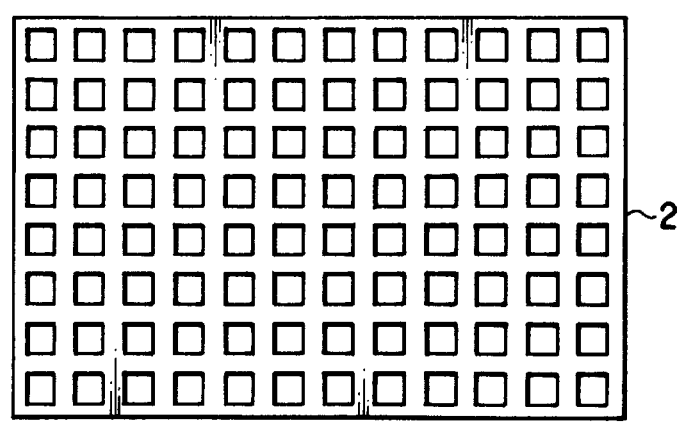
FIG. 11 is a plan view showing another uneven pattern of a buried silicon oxide film.

FIGS. 10 and 11 are plan views showing uneven patterns of buried silicon oxide films 2, used in the first to seventh embodiments.

FIG. 10 shows an example of the uneven pattern having concave portions with a circular plane shape and FIG. 11 shows an example of the uneven pattern having concave portions with a square (polygonal) plane shape. The above uneven patterns can be easily formed by use of the known photolithographic technique, or etching technique.

Figure 12A:
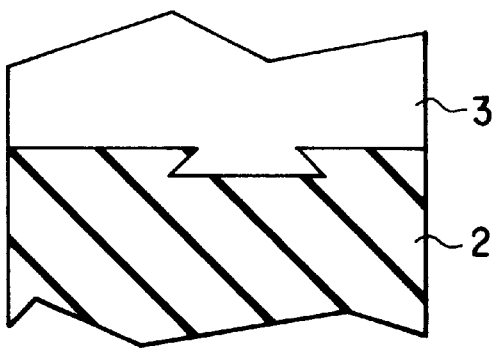
FIGS. 12A to 12E are cross sectional views showing uneven patterns of buried silicon oxide films.
Figure 12B:
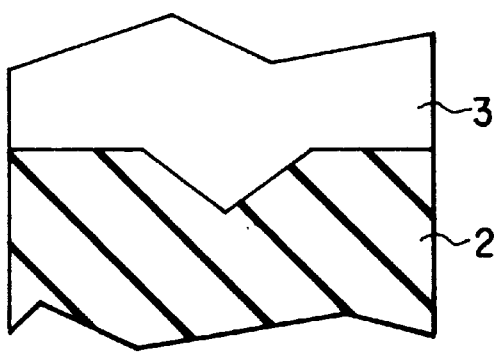
Figure 12C:
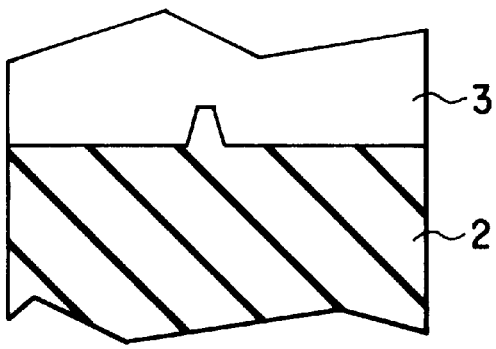
Figure 12D:
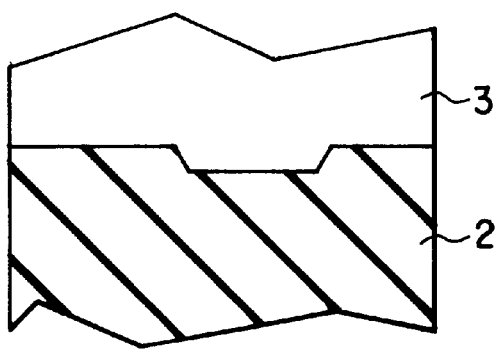
Figure 12E:
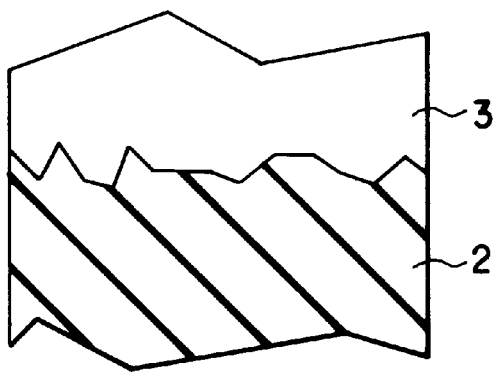

FIGS. 12A to 12E are cross sectional views showing uneven patterns of buried silicon oxide film 2, used in the first to seventh embodiments. FIG. 12A shows an example of the uneven pattern having concave portions with an inversely tapered cross section, FIG. 12B shows an example of the uneven pattern having concave portions with a triangular cross section, FIG. 12C shows an example of the uneven pattern having convex portions with a tapered cross section, FIG. 12D shows an example of the uneven pattern having concave portions with a trapezoidal cross section, and FIG. 12E shows an example of the uneven pattern having an uneven surface portion with an irregular cross section.

FIG. 13 is a cross sectional view showing the internal structure of a power semiconductor device (pin diode) according to an eighth embodiment of the present invention.

The power semiconductor device of the eighth embodiment is different from that of the first embodiment (FIG. 2) in that floating electrodes 9 are formed in the buried silicon oxide layer 2. In other words, in the eighth embodiment, the buried silicon oxide film 2 having the floating electrodes 9 buried therein is used.

When a voltage is applied to the power semiconductor device with the above structure and is gradually raised, an avalanche phenomenon occurs to produce electrons $e^-$ and holes $h^+$ by an intense electric field created in the device when the voltage reaches a certain level as shown in FIG. 14. The holes $h^+$ are injected into the floating electrodes 9 via the buried silicon oxide film 2 on the same principle as in the case of the EPROM so that the floating electrode 9 will be positively charged. As a result, the density of the electric field in the device can be lowered.

Figure 15:
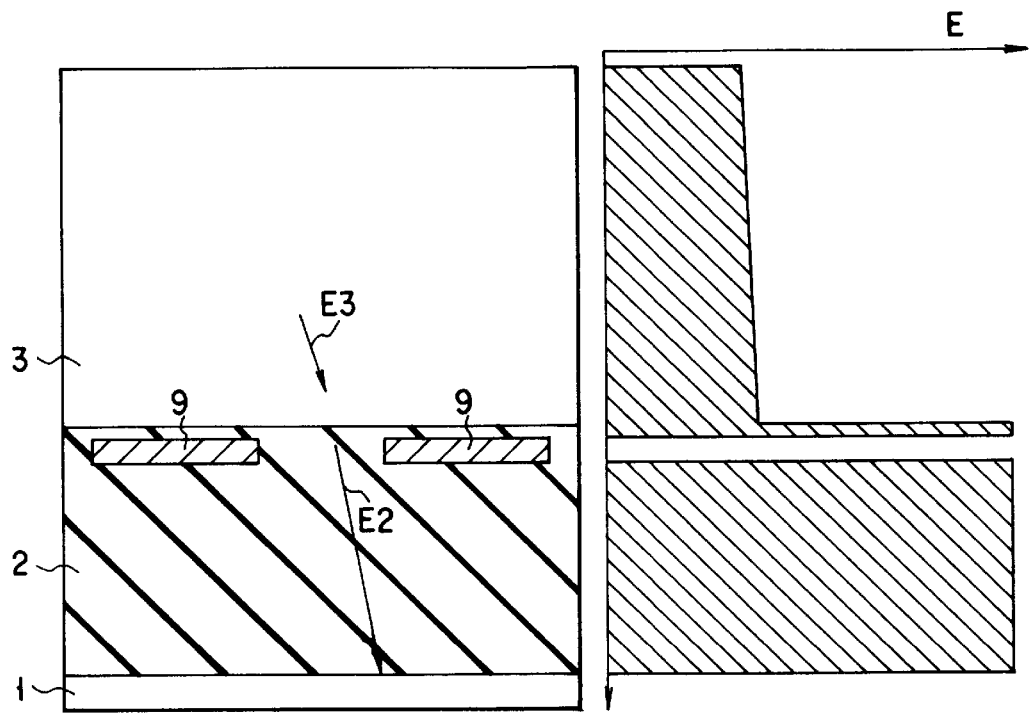
FIG. 15 is a diagram showing the distribution of electric field in a portion inside the device prior to occurrence of avalanche phenomenon.
Figure 16:
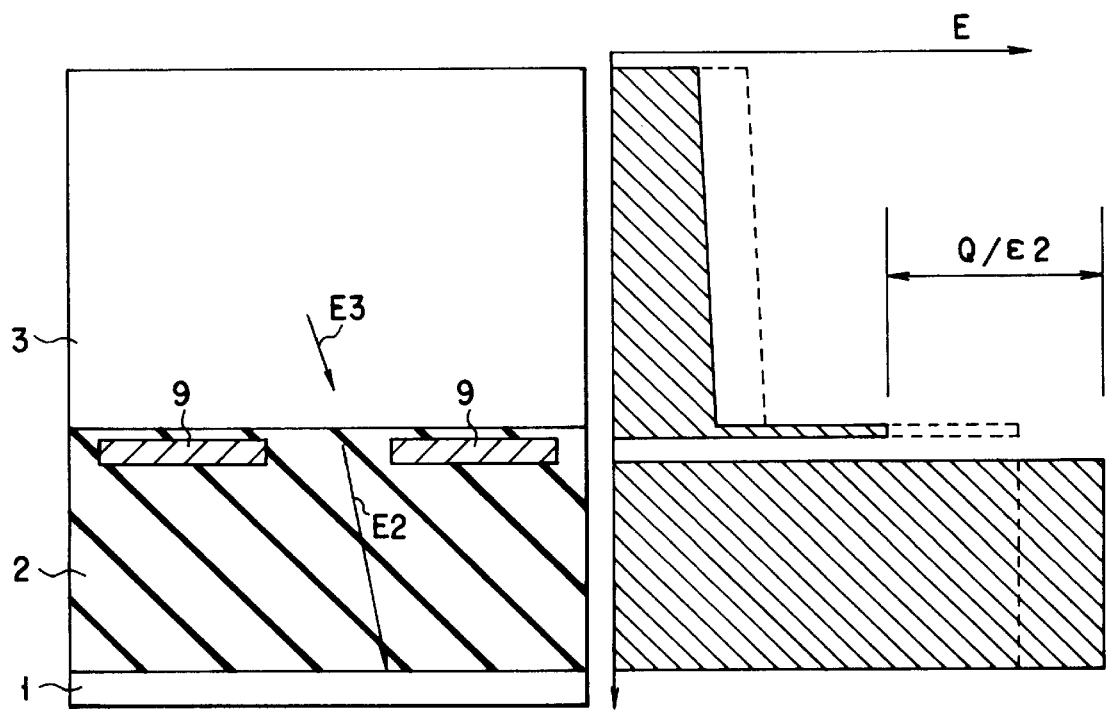
FIG. 16 is a diagram showing the distribution of electric field in a portion inside the device after occurrence of avalanche phenomenon.

FIG. 15 shows the distribution of the electric field in a portion inside the device prior to occurrence of the avalanche phenomenon and FIG. 16 shows the distribution of electric field in a portion inside the device after occurrence of the avalanche phenomenon. E2 is the electric field in the silicon oxide film 2 and E3 is the electric field in the n-type silicon active layer 3 in both FIGS. 15 and 16. If the amount of charges stored in the floating electrode 9 is Q, the electric field in the n-type silicon active layer 3 after occurrence of the avalanche phenomenon is reduced by an amount corresponding to $Q/\epsilon_2$. That is, if the avalanche phenomenon occurs, the area of the n-type silicon active layer 3 indicated by oblique lines in FIG. 15 is reduced by an amount corresponding to $Q/\epsilon_2$ as shown in FIG. 16. Even if a voltage of the same level as before is applied in a portion of the n-type silicon active layer 3 corresponding to a portion of the charged floating electrode 9 into which holes are injected, no avalanche phenomenon occurs. That is, if the floating electrode 9 has charges stored therein, a portion in which the avalanche phenomenon has occurred in the device is stored and the charges stored in the floating electrode 9 act to prevent occurrence of the avalanche phenomenon in the portion even when the voltage is applied.

In the eighth embodiment, a pulse voltage or a voltage which is gradually raised is applied to the power semiconductor device before device operation to cause an avalanche phenomenon in the n-type silicon active layer 3 and charge required ones of the plurality of floating electrodes 9 so as to realize a power semiconductor device with a high withstand voltage.

In order to effectively charge the floating electrodes 9, it is preferable to set the distance $d_1$ from the surface of the buried silicon oxide film 2 to the surface of the floating electrode 9 in the range of 200 nm>$d_1$>5 nm as shown in FIG. 14. Further, if the thickness of the buried silicon oxide film 2 is $t_{OX}$, it is preferable to set the vertical width $d_2$ of the floating electrode 9 in the range of $d_2<t_{OX}/2$. Further, the lateral width $W_3$ of the floating electrode 9 is preferably set to be smaller than the drift length (the distance between the n-type emitter layer 4 and the p-type emitter layer 5) and the interval $W_4$ between the floating electrodes 9 is preferably set in the range of $W_4<3t_{OX}$.

Figures 17A, 17B:
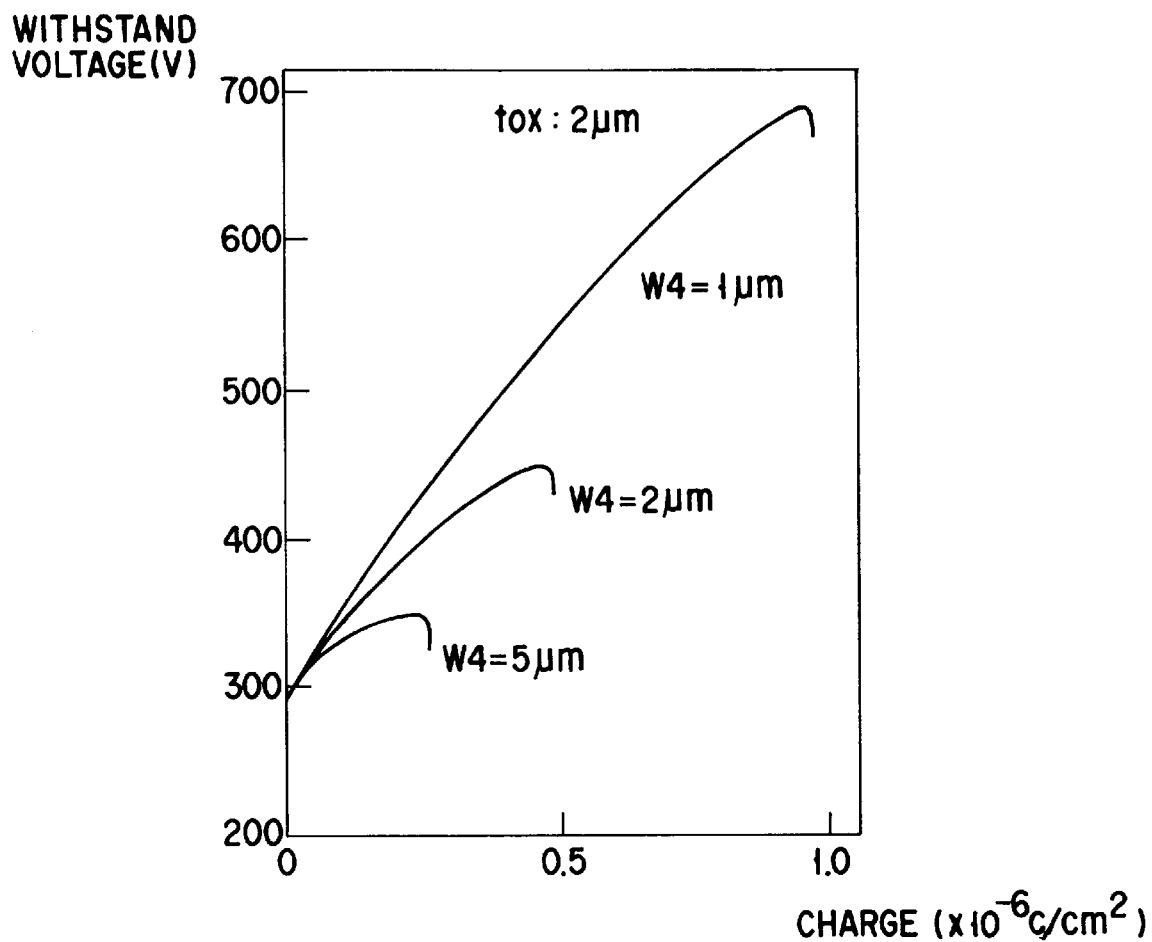
FIGS. 17A and 17B are diagrams for illustrating the result of measurement of withstand voltage of the power semiconductor device shown in FIG. 13.

FIGS. 17A and 17B are diagrams for illustrating the result of computer simulation result of the withstand voltage of the power semiconductor device. In FIG. 17A, a graph indicating the relation between charges of the floating electrode 9 and the withstand voltage is shown. As is understood from the graph, the withstand voltage can be increased as the interval $W_4$ between the floating electrodes 9 is made smaller. At this time, the thickness $t_{OX}$ of the buried silicon oxide film 2 is set to 2 μm. In FIG. 17B, data of the withstand voltage values obtained when the thickness $t_{OX}$ of the buried silicon oxide film 2 and the interval $W_4$ between the floating electrodes 9 are changed is shown. As is understood from the data, the withstand voltage can be increased as the thickness $t_{OX}$ of the buried silicon oxide film 2 is made larger.

Figure 18:
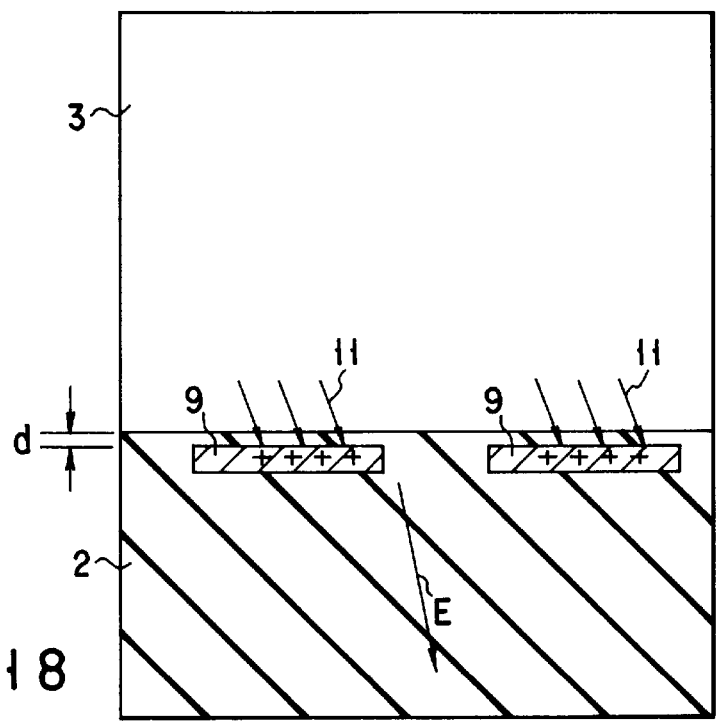
FIG. 18 is a cross sectional view showing the internal structure of a power semiconductor device (pin diode) according to a ninth embodiment of the present invention.

FIG. 18 is a cross sectional view showing the internal structure of a power semiconductor device (pin diode) according to a ninth embodiment of the present invention.

The power semiconductor device of the ninth embodiment is different from that of the eighth embodiment (FIG. 13) in that the distance d between the surface of the floating electrode 9 and the surface of the buried silicon oxide layer 2 is set to 5 nm or less. That is, in the ninth embodiment, the floating electrode 9 is formed extremely close to the surface of the buried silicon oxide film 2 and holes are injected into the floating electrodes 9 not by the avalanche phenomenon but by the tunnel effect. In this case, if the direction of the electric field in the n-type silicon layer 3 and the buried silicon oxide film 2 is reversed, electrones are injected into the electrodes 9 by the tunnel effect.

When the floating electrode is charged up or discharged, it is possible to minutely control the charge amount of the floating electrode by biasing the substrate potential in the same manner as in the case of the control gate of EEPROM. That is, the charge amount of the floating electrode is minutely adjusted by respectively providing variable power supplies for the substrate, cathode electrode and anode electrode so as to independently control the substrate potential, cathode electrode potential and anode electrode potential, and controlling the variable power supplies so as to increase the potential difference between the substrate and the cathode electrode and the potential difference between the substrate and the anode electrode and reduce the potential difference between the cathode electrode and the anode electrode.

Figure 19:
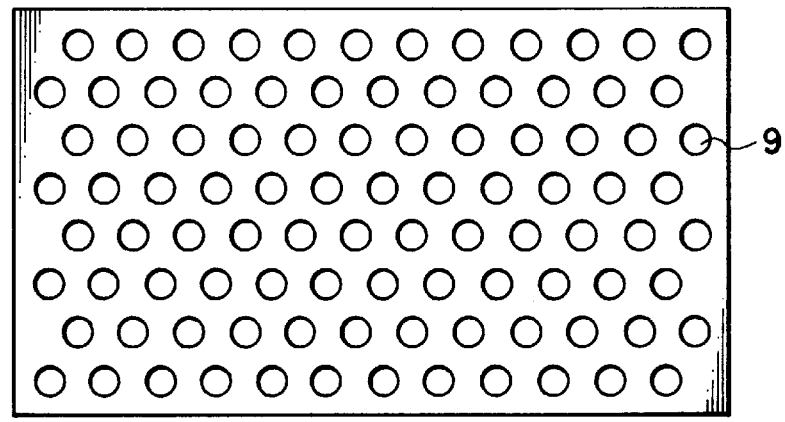
FIG. 19 is a plan view showing the plane shape of the floating electrode.
Figure 20:
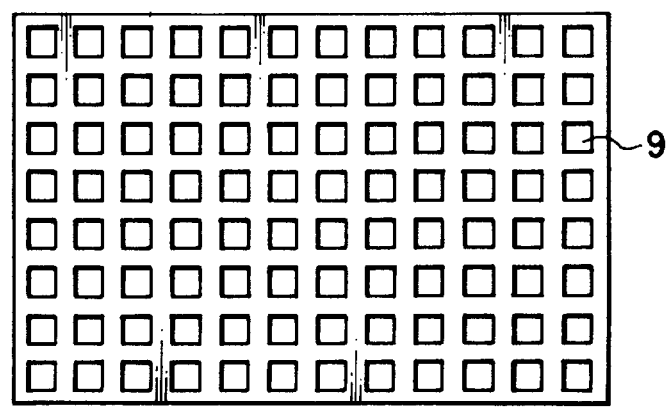
FIG. 20 is a plan view showing another plane shape of the floating electrode.

FIGS. 19 and 20 are plan views showing the plane shapes of the floating electrodes used in the eighth and ninth embodiments.

FIG. 19 shows an example of the floating electrodes 9 with a circular plane shape. In this case, the directivity of the electric field is lost and there is no portion in which the electric field is concentrated. Further, FIG. 20 shows an example of the floating electrodes 9 with a square (polygonal) plane shape. In this case, since the number of floating electrodes for each unit area can be increased, the density of the electric field in the device can be effectively lowered. In this case, it is possible to use floating electrodes 9 of stripe form.

Figure 21:
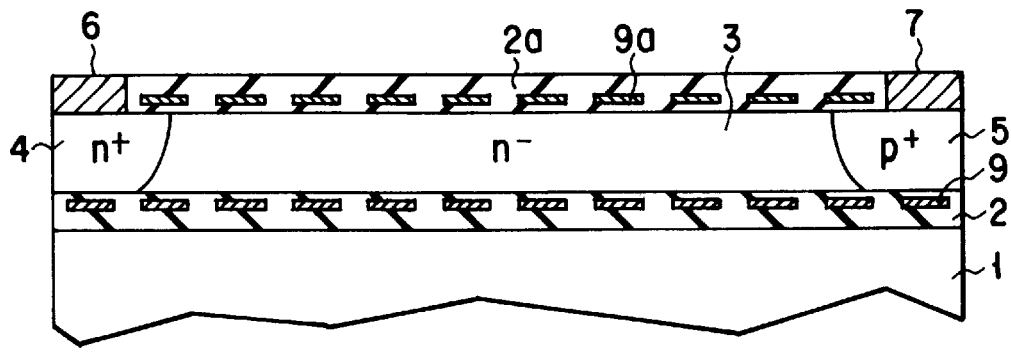
FIG. 21 is a cross sectional view showing the internal structure of a power semiconductor device (pin diode) according to a tenth embodiment of the present invention.

FIG. 21 is a cross sectional view showing the internal structure of a power semiconductor device (pin diode) according to a tenth embodiment of the present invention.

The power semiconductor device of the tenth embodiment is different from that of the eighth embodiment (FIG. 13) in that a silicon oxide layer 2a having floating electrodes 9a buried therein is formed on the n-type silicon active layer 3. According to the tenth embodiment, the density of the electric field in the upper-side portion of the n-type silicon active layer 3 can be effectively lowered.

Figure 22:
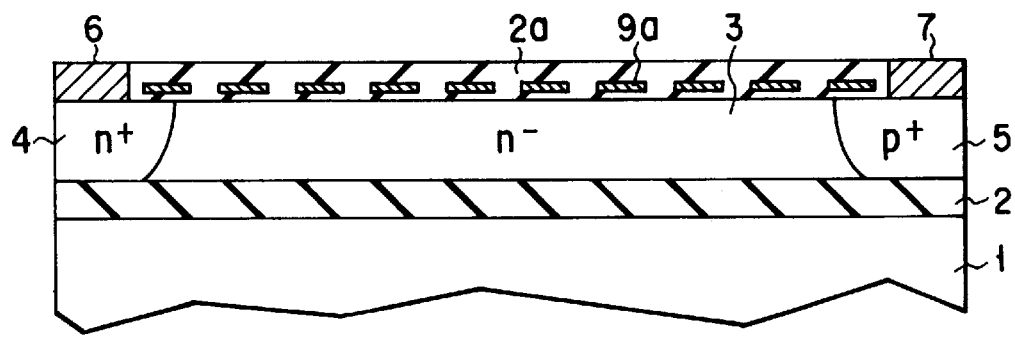
FIG. 22 is a cross sectional view showing the internal structure of a power semiconductor device (pin diode) according to an eleventh embodiment of the present invention.

FIG. 22 is a cross sectional view showing the internal structure of a power semiconductor device (pin diode) according to an eleventh embodiment of the present invention.

The power semiconductor device of the eleventh embodiment is different from that of the tenth embodiment (FIG. 21) in that no floating electrode is formed in the buried silicon oxide film 2. If the buried silicon oxide film 2b is thick, a sufficiently high withstand voltage is obtained. In other words, if the buried silicon oxide film 2 is thick, a sufficiently high withstand voltage is obtained only by use of the buried silicon oxide film 2a.

Figure 23:
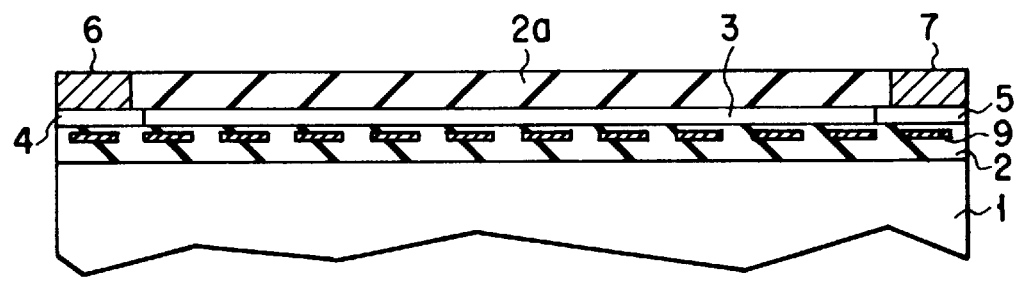
FIG. 23 is a cross sectional view showing the internal structure of a power semiconductor device (pin diode) according to a twelfth embodiment of the present invention.
Figure 24:
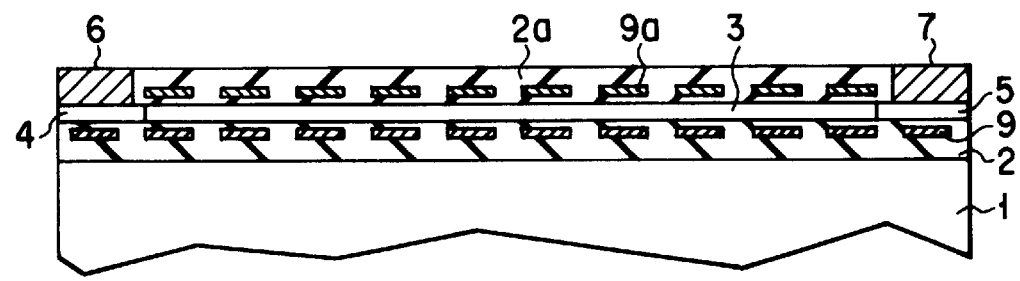
FIG. 24 is a cross sectional view showing the internal structure of a power semiconductor device (pin diode) according to a thirteenth embodiment of the present invention.
Figure 25:
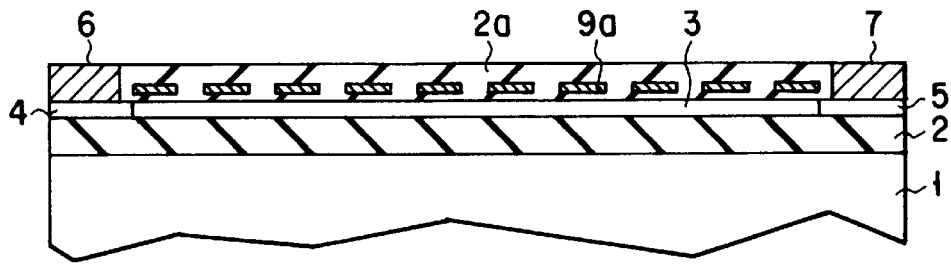
FIG. 25 is a cross sectional view showing the internal structure of a power semiconductor device (pin diode) according to a fourteenth embodiment of the present invention.
Figure 26:
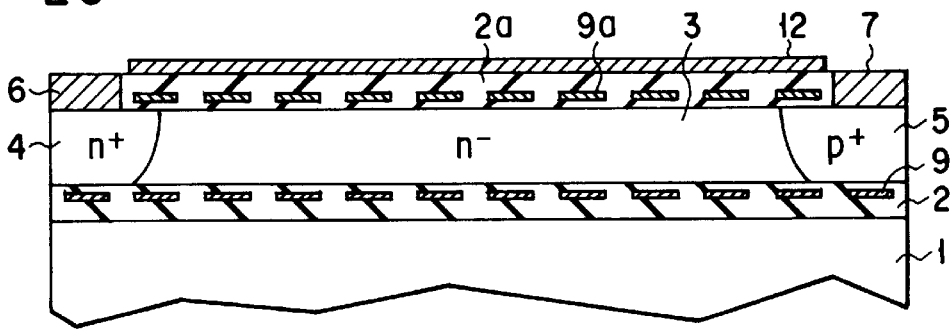
FIG. 26 is a cross sectional view showing the internal structure of a power semiconductor device (pin diode) according to a fifteenth embodiment of the present invention.
Figure 27:
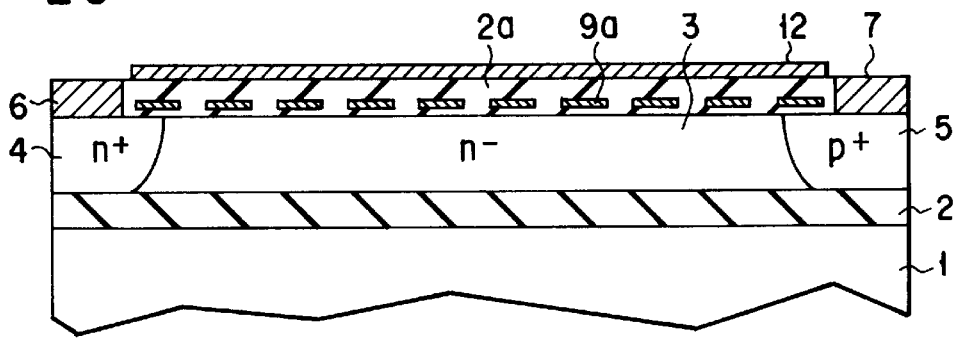
FIG. 27 is a cross sectional view showing the internal structure of a power semiconductor device (pin diode) according to a sixteenth embodiment of the present invention.
Figure 28:
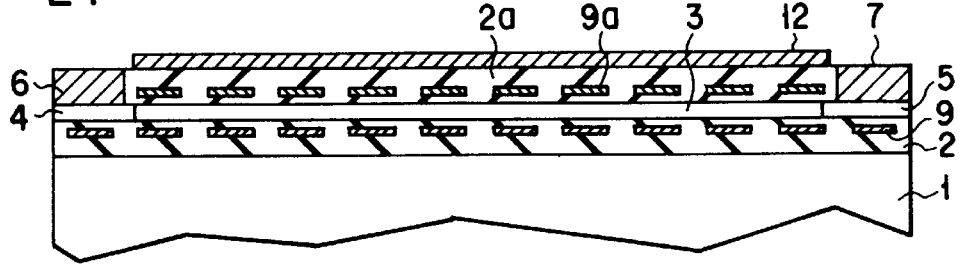
FIG. 28 is a cross sectional view showing the internal structure of a power semiconductor device (pin diode) according to a seventeenth embodiment of the present invention.
Figure 29:
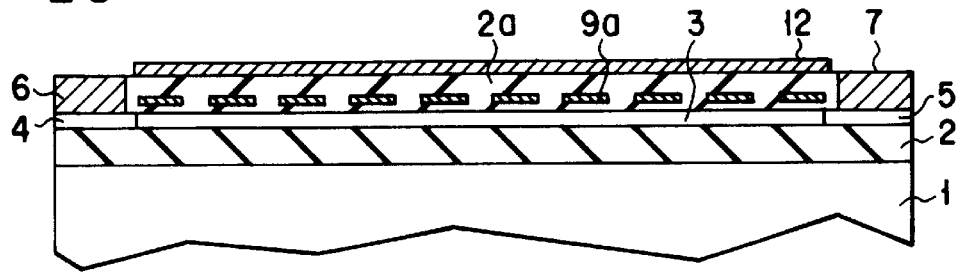
FIG. 29 is a cross sectional view showing the internal structure of a power semiconductor device (pin diode) according to an eighteenth embodiment of the present invention.

FIGS. 23 to 25 are cross sectional views showing the internal structures of power semiconductor devices (pin diodes) according to twelfth to fourteenth embodiments of the present invention. The power semiconductor devices of FIGS. 23 to 25 are obtained by reducing the thicknesses of the n-type silicon active layers 3 of the power semiconductor devices of FIGS. 13, 21 and 22.

FIGS. 26 to 29 are cross sectional views showing the internal structures of power semiconductor devices (pin diodes) according to fifteenth to eighteenth embodiments of the present invention. The power semiconductor devices of FIGS. 26 to 29 are obtained by forming upper electrodes 12 on the respective buried silicon oxide films 2a of the power semiconductor devices of FIGS. 21, 22, 24, 25. According to the fifteenth to eighteenth embodiments, the charge amount of the floating electrode 9a can be minutely controlled by a voltage applied to the upper electrode 12. Further, by connecting the upper electrode 12 to the cathode electrode 6 or anode electrode 7, an influence by the electric field in the upper portion of the device can be alleviated.

FIG. 30 is a cross sectional view showing the internal structure of a power semiconductor device (MOSFET) according to a nineteenth embodiment of the present invention.

In the eighth embodiment (FIG. 13), the buried silicon oxide film according to the present invention is applied to the pin diode, but in the nineteenth embodiment, it is applied to a MOSFET. In this case, as shown in FIG. 30, an n-type drain layer 31 and a p-type well layer 32 are formed in the surface area of an n-type silicon active layer 3. Further, an n-type source layer 33 is formed in the surface area of the p-type well layer 32. Further, a drain electrode 34 is formed on the n-type drain layer 31, and a source electrode 35 is formed on the p-type well layer 32 and n-type source layer 33. A gate electrode 36 is formed on the n-type source layer 33, the p-type well layer 32, and n-type silicon active layer 3 via a gate oxide film 37.

With the above structure, like the case of the first and eighth embodiments, the density of the electric field in the device can be lowered and a MOSFET whose withstand voltage is higher than that of the conventional case can be obtained.

FIG. 31 is a cross sectional view showing the internal structure of a power semiconductor device (IGBT) according to a twentieth embodiment of the present invention.

In the eighth embodiment (FIG. 13), the buried silicon oxide film according to the present invention is applied to the pin diode, but in the twentieth embodiment, it is applied to an IGBT. In this case, as shown in FIG. 31, an n-type buffer layer 38 and a p-type well layer 32 are formed in the surface area of an n-type silicon active layer 3. Further, a p-type emitter layer 39 is formed in the surface area of the n-type buffer layer 38 and an n-type source layer 33 is formed in the surface area of the p-type well layer 32. Further, a drain electrode 34 is formed on the p-type emitter layer 39, and a source electrode 35 is formed on the p-type well layer 32 and n-type source layer 33. A gate electrode 36 is formed on the n-type source layer 33, the p-type well layer 32, and n-type silicon active layer 3 via a gate oxide film 37.

With the above structure, like the case of the eighth embodiment, the density of electric field in the device can be lowered and an IGBT whose withstand voltage is higher than that of the conventional case can be obtained.

FIG. 32 is a cross sectional view showing the internal structure of a power semiconductor device (thyristor) according to a twenty-first embodiment of the present invention.

In the eighth embodiment (FIG. 13), the buried silicon oxide film according to the present invention is applied to the pin diode, but in the twenty-first embodiment, it is applied to a thyristor. In this case, as shown in FIG. 32, an n-type buffer layer 38 and a p-type base layer 40 are formed in the surface area of an n-type silicon active layer 3. Further, a p-type emitter layer 39 is formed in the surface area of the n-type buffer layer 38 and an n-type source layer 33 is formed in the surface area of the p-type base layer 40. Further, a drain electrode 34 is formed on the p-type emitter layer 39, and a source electrode 41 is formed on the p-type base layer 40 and n-type source layer 33. A gate electrode 36 is formed on the n-type source layer 33, the p-type base layer 40, and n-type silicon active layer 3 via a gate oxide film 37. In the driving operation, a switching circuit having a different gate 42 shown in FIG. 32 is connected to the source electrode 41, for example.

With the above structure, like the case of the eighth embodiment, the density of the electric field in the device can be lowered and a thyristor whose withstand voltage is higher than that of the conventional case can be obtained.

Figure 33:
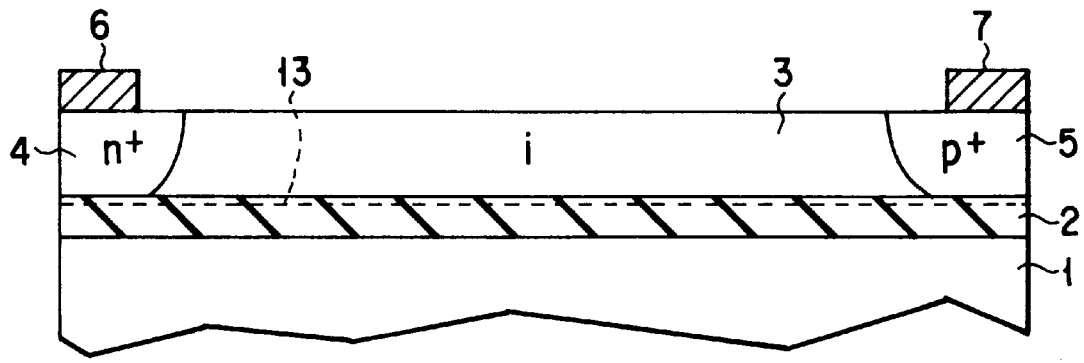
FIG. 33 is a cross sectional view showing the internal structure of a power semiconductor device (pin diode) according to a twenty-second embodiment of the present invention.

FIG. 33 is a cross sectional view showing the internal structure of a power semiconductor device (pin diode) according to a twenty-second embodiment of the present invention.

The power semiconductor device of the twenty-second embodiment is different from that of the eighth embodiment (FIG. 13) in that an ion-implanted layer 13 formed by implanting metal ions such as Au into the surface portion of the n-type silicon active layer is used instead of the floating electrode. The ion-implanted layer 13 functions as a charged floating electrode, and therefore, the same effect as that obtained by use of the floating electrode can be attained.

Figure 34:
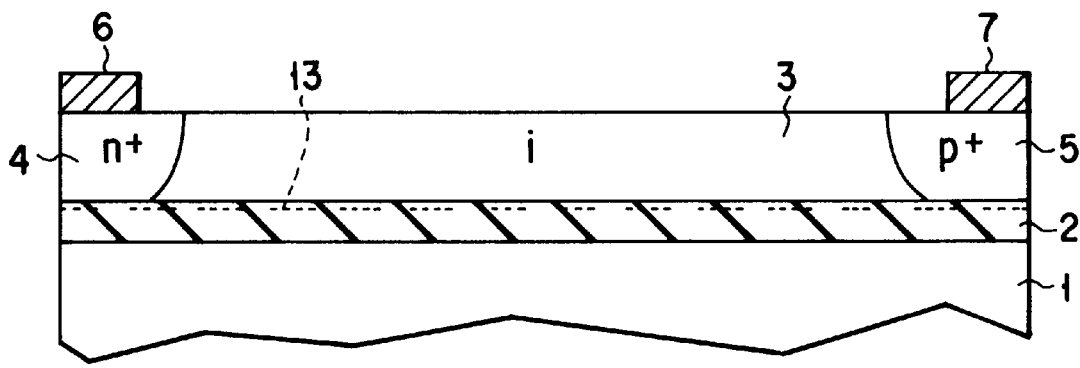
FIG. 34 is a cross sectional view showing the internal structure of a power semiconductor device (pin diode) according to a twenty-third embodiment of the present invention.

FIG. 34 is a cross sectional view showing the internal structure of a power semiconductor device (pin diode) according to a twenty-third embodiment of the present invention.

The power semiconductor device of the twenty-third embodiment is different from that of the twenty-second embodiment (FIG. 33) in that discrete ion-implanted layers 13 are formed by partially implanting metal ions. In the twenty-third embodiment, since two adjacent ion-implanted layers 13 are isolated from each other by an oxide film, holes trapped in the ion-implanted layer 13 will not move into the adjacent ion-implanted layer 13, thereby making it possible to prevent occurrence of a leak current.

Figure 35:
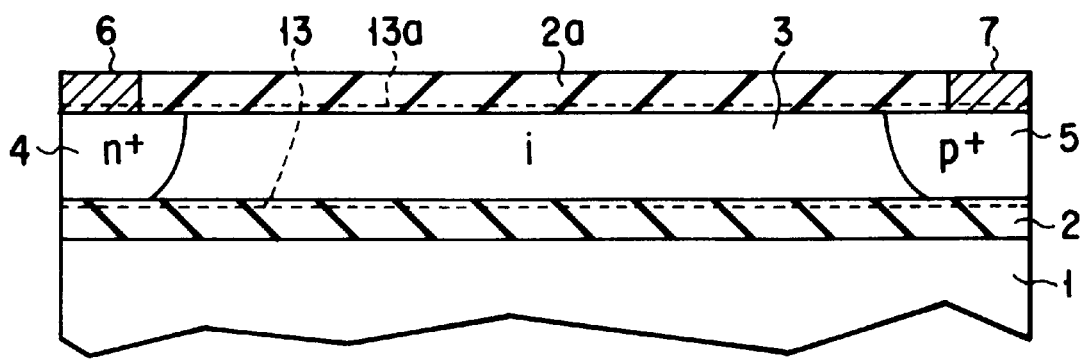
FIG. 35 is a cross sectional view showing the internal structure of a power semiconductor device (pin diode) according to a twenty-fourth embodiment of the present invention.

FIG. 35 is a cross sectional view showing the internal structure of a power semiconductor device (pin diode) according to a twenty-fourth embodiment of the present invention.

The power semiconductor device of the twenty-fourth embodiment is different from that of the twenty-second embodiment (FIG. 33) in that a silicon oxide film 2a having an ion-implanted layer 13a formed therein is formed on the upper surface of the n-type silicon active layer 3. According to the twenty-fourth embodiment, the density of the electric field in the upper portion of the n-type silicon active layer 3 can be made small and the withstand voltage can be further enhanced. If the buried silicon oxide film 2 is thick, the ion implanted layer of the buried silicon oxide film 2 may be omitted.

Figure 36:
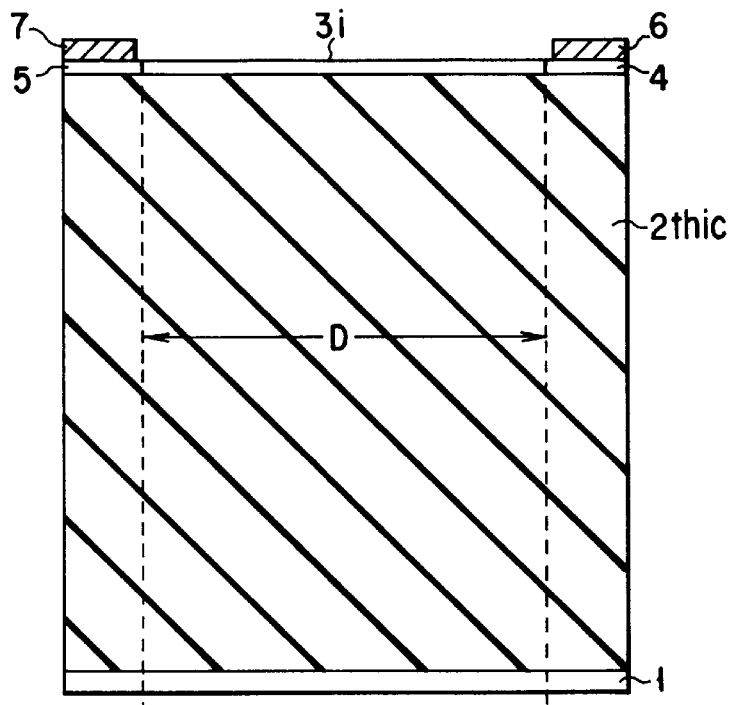
FIG. 36 is a cross sectional view showing the internal structure of a power semiconductor device (pin diode) according to a twenty-fifth embodiment of the present invention and an impurity profile thereof.

FIG. 36 is a cross sectional view showing the internal structure of a power semiconductor device (pin diode) according to a twenty-fifth embodiment of the present invention.

In FIG. 36, a reference symbol $2_{thic}$ indicates a thick buried insulative film with a thickness of approx. 1 to several hundred $\mu$m formed of quartz glass. That is, the thickness of the buried silicon oxide film $2_{thic}$ is substantially the same as the drift length D (the length of the n-type silicon active layer 3 of a portion except the n-type emitter layer 4 and p-type emitter layer 5) of the device.

The feature of the twenty-fifth embodiment is that the impurity concentration profile of the i-type silicon active layer $3i$ of high resistance in the drift length direction is formed such that the p-type impurity concentration becomes increasingly greater in the direction of the p-type emitter and the n-type concentration becomes increasingly greater in the direction of the n-type emitter. This arrangement of impurities results in an impurity concentration profile such as that shown in FIG. 36. This profile resembles a tangent function. For the sake of simplicity, and since there is a single inflection point near the x-axis, the shape of the impurity profile function described above and shown in FIG. 36 can be described as being S-shaped. Preferably, a portion of approx. 1/10 to 1/2 of the i-type silicon active layer $3i$ is formed as a p-type region. That is, a region ranging from the position "0" to the position approx. D/10 to D/2 is formed as a p-type region in the form of letter "S".

Figure 39:
FIG. 39 is a diagram showing the distribution of electric field in the power semiconductor device shown in FIG. 36.

FIG. 39 is a diagram showing the distribution of electric field in the i-type silicon active layer (drift layer) $3i$ of the twenty-fifth embodiment. In FIG. 39, a reference symbol P4 indicates the position of an n-type emitter layer 4, and a reference symbol P5 indicates the position of a p-type emitter layer 5. As is understood from FIG. 39, the electric field in the i-type silicon active layer $3i$ is Ec and constant and there is no portion in which the withstand voltage is partially lowered.

Figure 37:
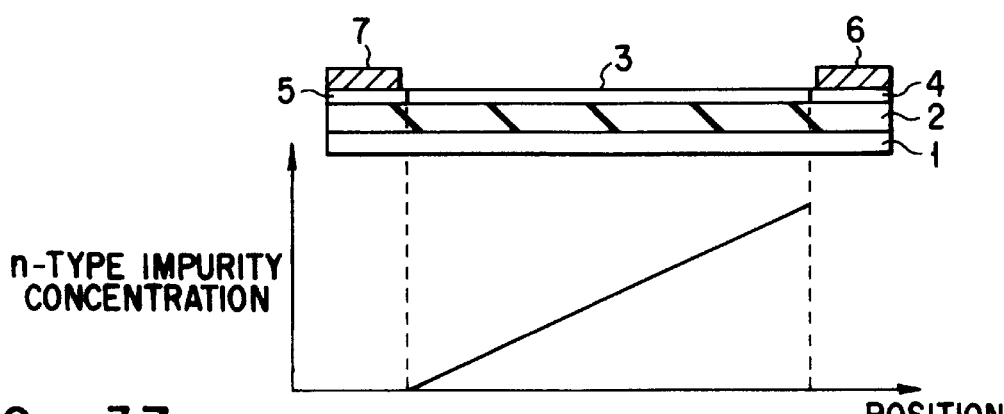
FIG. 37 is a diagram showing the internal structure of a conventional power semiconductor device and an impurity profile thereof.

FIG. 37 is a diagram showing the internal structure of a conventional power semiconductor device and an impurity concentration profile thereof. That is, FIG. 37 shows an n-type impurity concentration profile in the internal structure in which the drift length is sufficiently larger than the thickness of the buried silicon oxide film 2. The n-type impurity concentration profile is defined in a linear form such that the n-type impurity concentration will become higher in a portion nearer to the n-type emitter layer 4. The electric field created when the n-type impurity concentration profile is applied to an n-type silicon active layer of a power semiconductor device having a thick buried silicon oxide film as in the twenty-fifth embodiment is shown in FIG. 38.

Figure 38:
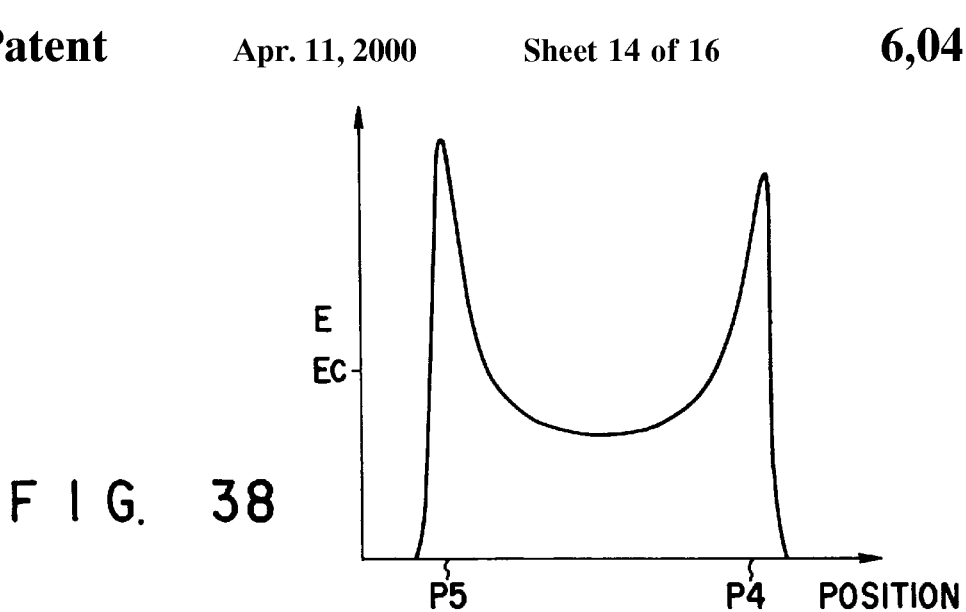
FIG. 38 is a diagram showing the distribution of electric field in the conventional power semiconductor device shown in FIG. 37.

From FIG. 38, it is understood that the electric field abruptly rises at both ends of the n-type silicon active layer (drift layer) and a portion in which the withstand voltage is partially lowered is present. If there is a portion having a low withstand voltage, the withstand voltage of the device is extremely lowered and a high withstand voltage cannot be obtained. The fact that the withstand voltage is lowered if the conventional linear impurity concentration profile is used in a case where the buried silicon oxide film is thick (when the thickness and the drift length of the buried silicon oxide film are substantially the same as each other) and a sufficiently high withstand voltage can be attained if the impurity concentration profile in the form of letter "S" in the twenty-fifth embodiment is used is a new fact which the inventors found.

Figure 40:
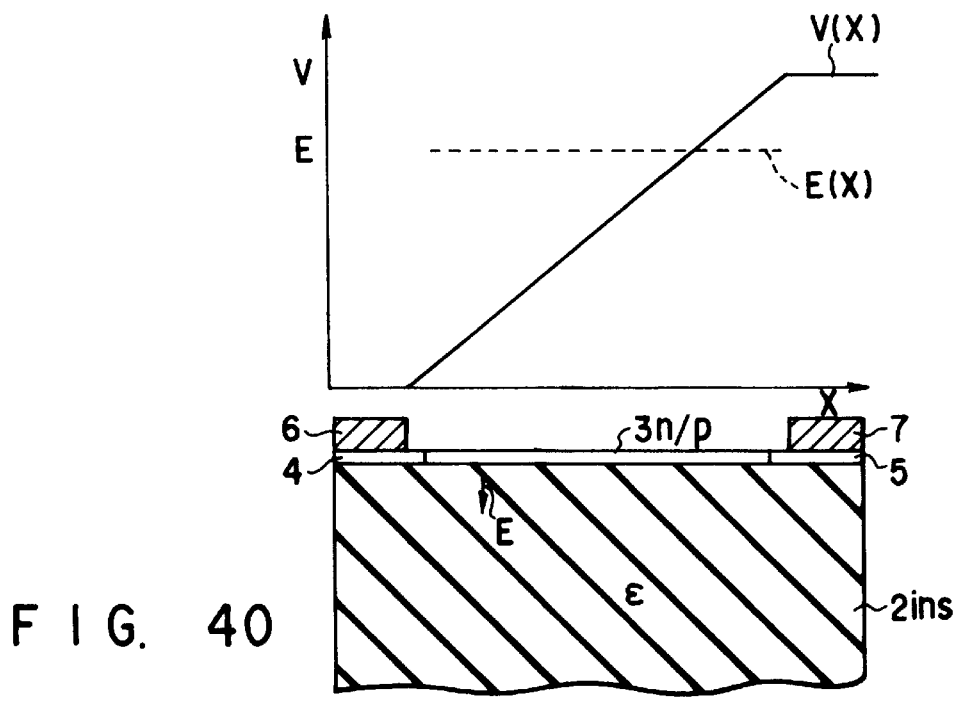
FIG. 40 is a diagram for illustrating the method of deriving an adequate impurity concentration profile when the buried insulative film is thick.

FIG. 40 is a diagram for illustrating the method of deriving an impurity concentration profile of a silicon active layer $3_{n/p}$ when the buried insulative film $2_{ins}$ is thick.

A voltage in the silicon active layer $3_{n/p}$ is set as the fixed boundary condition, an electric field E(x) having a constant potential in the horizontal direction is applied to the silicon active layer $3_{n/p}$, and the distribution of the electric field in the device is derived by use of an analytical method, device simulation or computer program for solving the Poisson equation, for example. If the electric field perpendicular to the interface between the buried insulative film $2_{ins}$ and the silicon active layer $3_{n/p}$ is set to Ev(x), an optimum impurity concentration profile N(x) is obtained as follows.

$$N(x) = \epsilon \cdot E_v(x)/(q \cdot t_{Si}) \qquad (2)$$

where $\epsilon$ indicates a dielectric factor of the buried insulative film $2_{ins}$, q indicates an elementary charge, and $t_{si}$ indicates the thickness of the silicon active layer $3_{n/p}$. If N(x) is negative, it is a p type, and if the N(x) is positive, it is an n type.

According to the method of the twenty-fifth embodiment, an optimum impurity profile can be mathematically derived even if the shape of the buried insulative film $2_{ins}$ is complicated or the device is formed in a 3-dimensional form.

In the twenty-fifth embodiment, a case wherein the buried insulative film is thick is explained, but even when the insulative film is thin, the optimum profile of high resistance layer takes a form of letter "S" close to a straight line. If the thickness of the insulative film exceeds ⅒₅ of the drift layer length, the curve of "S" becomes steep and it is preferable to set the profile in the form of letter "S" for the withstand voltage. Further, in the twenty-fifth embodiment, the buried insulative film according to the present invention is applied to the pin diode, but a high withstand voltage can be attained when it is applied to a MOSFET, IGBT, or thyristor.

Figure 41:
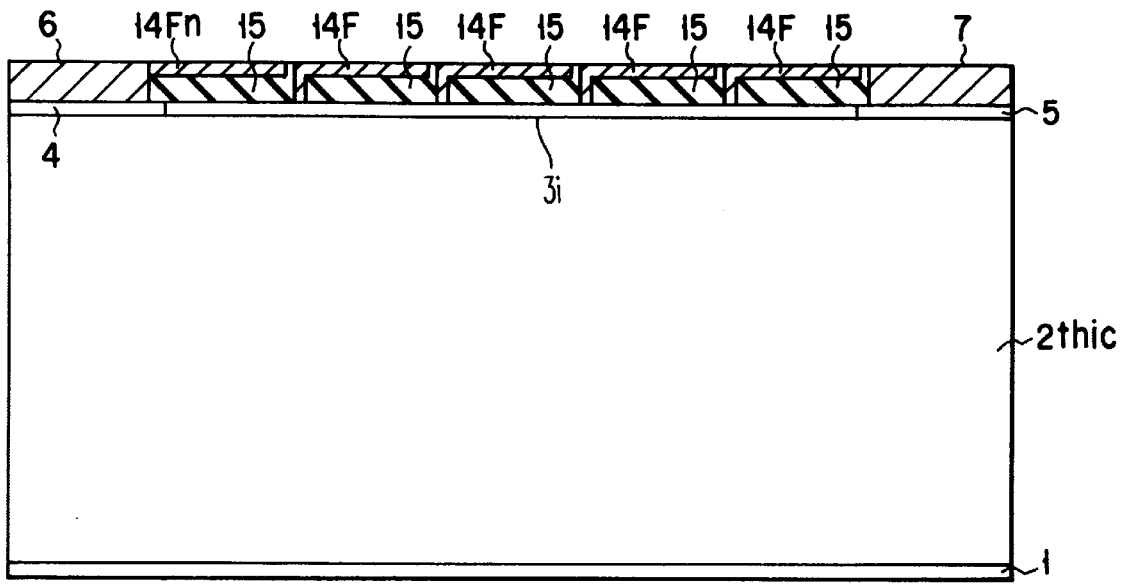
FIG. 41 is a cross sectional view showing the internal structure of a power semiconductor device (pin diode) according to a twenty-sixth embodiment of the present invention.

FIG. 41 is a cross sectional view showing the internal structure of a power semiconductor device (pin diode) according to a twenty-sixth embodiment of the present invention with a thick insulative film $2_{thic}$.

The power semiconductor device of the twenty-sixth embodiment is different from that of the twenty-fifth embodiment (FIG. 36) in that multi-stage field plates $14_F$, $14_{Fn}$ are formed on an i-type silicon active layer $3i$. The field plate $14_F$ is a floating field plate which is not connected to the cathode electrode 6, and the field plate $14_{Fn}$ is a floating field plate which is connected to the anode electrode 7. Further, the adjacent field plates are isolated from each other by a corresponding one of insulative films 15.

When the field plate is formed of metal, the field plate $14_F$ and the i-type silicon active layer $3i$ are connected by Schottky junction or the field plate $14_F$ is connected to the i-type silicon active layer $3i$ via a diffusion layer. If it is connected via the diffusion layer, it is preferable to connect the field plate $14_F$ in a region of high n-type impurity concentration on the cathode electrode 4 side to the i-type silicon active layer $3i$ via an n-type diffusion layer and connect the field plate $14_F$ in a region of high p-type impurity concentration on the anode electrode 5 side to the i-type silicon active layer $3i$ via a p-type diffusion layer.

Further, if the field plate is formed of polysilicon, the field plate $14_F$ and the i-type silicon active layer $3i$ are directly connected to each other or the field plate $14_F$ is connected to the i-type silicon active layer $3i$ via a polysilicon layer. Like the former case, if it is connected via a diffusion layer, it is preferable to connect the field plate $14_F$ on the cathode electrode 4 side to the i-type silicon active layer $3i$ via an n-type diffusion layer and connect the field plate $14_F$ on the anode electrode 5 side to the i-type silicon active layer $3i$ via a p-type diffusion layer.

According to the twenty-sixth embodiment, the withstand voltage can be further increased by the field plates $14_F$, $14_{Fn}$. Since the withstand voltage can be enhanced, the impurity concentration of the i-type silicon active layer $3i$ can be made higher and the ON voltage (ON-resistance) can be lowered.

Figure 42:
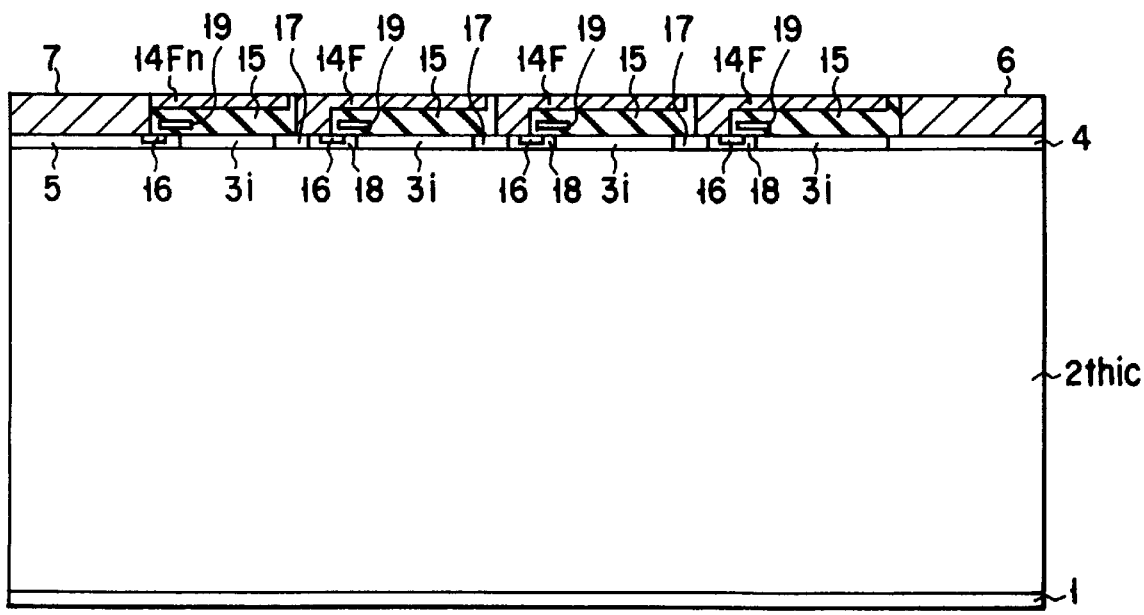
FIG. 42 is a cross sectional view showing the internal structure of a power semiconductor device (MOSFET) according to a twenty-seventh embodiment of the present invention.

FIG. 42 is a cross sectional view showing the internal structure of a power semiconductor device (MOSFET) according to a twenty-seventh embodiment of the present invention.

The twenty-seventh embodiment is an example in which a plurality of MOSFETs serially connected are formed on i-type silicon active layers $3i$ formed on a thick buried silicon oxide film $2_{thic}$. Each of the MOSFETs is constructed by an n-type source layer 16 of high impurity concentration selectively formed in the surface area of a p-type emitter layer 5 (which is a p-type emitter layer as a p-type well layer in this example), an n-type drain layer 17 selectively formed in the surface area of the i-type silicon active layer $3i$, a p-type emitter layer (p-type well layer) 5 between the n-type drain layer 17 and the n-type source layer 16, and a gate electrode 19 formed in an insulative film 15 on the i-type silicon active layer $3i$. In this case, the insulative film 15 is formed of a thin insulative film used as a gate insulative film and a thick insulative film covering the gate electrode 19.

In the conventional SOI substrate, since the buried silicon oxide film is relatively thin, a high withstand voltage cannot be obtained if devices are serially connected without giving any particular attention. On the other hand, when the buried silicon oxide film is thick, a high withstand voltage can be attained by making the impurity concentration of the i-type silicon active layer sufficiently small even if devices are serially connected. However, in this case, a problem that the ON voltage becomes high occurs.

In contrast, in the case of the twenty-seventh embodiment, the withstand voltage is increased by the impurity concentration profile in the form of letter "S" and charges caused when the i-type silicon active layer $3i$ is depleted can be canceled by the field plates $14_F$, $14_{Fn}$. Therefore, according to the twenty-seventh embodiment, since the impurity concentration of the i-type silicon active layer $3i$ can be made high even when the thick buried silicon oxide film $2_{thic}$ is used, both the high withstand voltage and the low ON voltage can be simultaneously attained.

Figure 43:
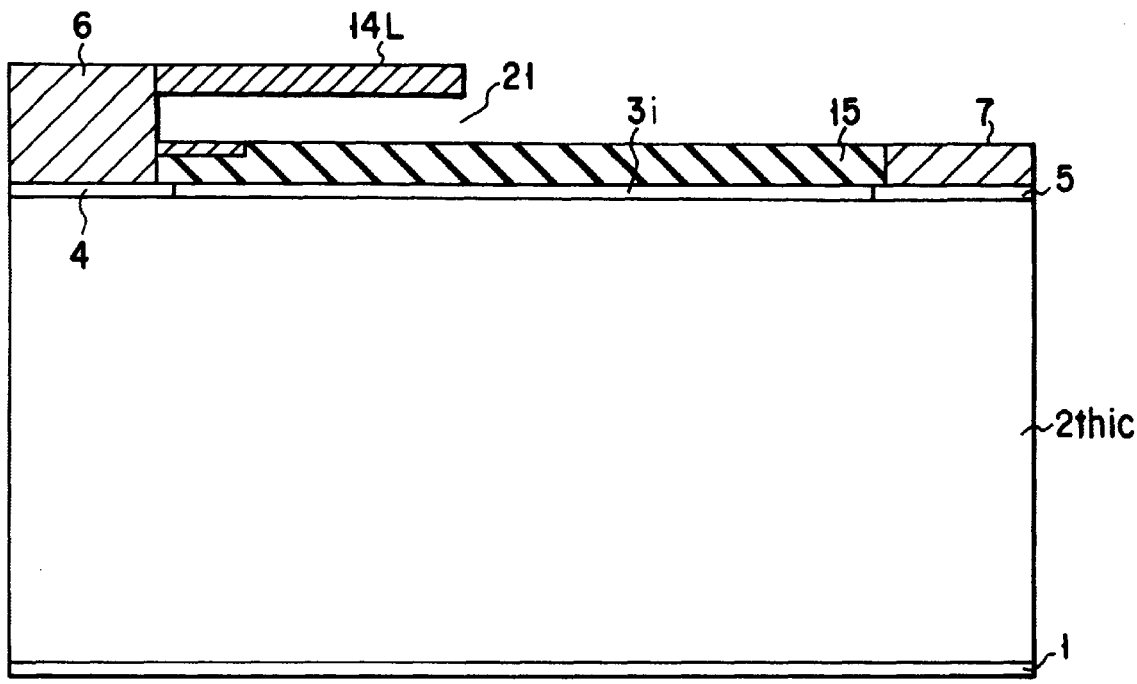
FIG. 43 is a cross sectional view showing the internal structure of a power semiconductor device (pin diode) according to a twenty-eighth embodiment of the present invention.

FIG. 43 is a cross sectional view showing the internal structure of a power semiconductor device (pin diode) according to a twenty-eighth embodiment of the present invention.

The power semiconductor device of the twenty-eighth embodiment is different from that of the twenty-fifth embodiment (FIG. 36) in that a long field plate $14_L$ is formed on the insulative film 15 with an insulative film 21 of insulative material (for example, air) other than the oxide disposed therebetween. When the buried silicon oxide film $2_{thic}$ is thick, concentration of the electric field occurs in a wide range in the conventional power semiconductor device. That is, concentration of the electric field occurs not only in the i-type silicon active layer $3i$ but in a portion near the n-type emitter layer 4 and p-type emitter layer 5. Further, even if concentration of the electric field does not occur, most part of the i-type silicon active layer $3i$ which is an n-type silicon layer of low impurity concentration becomes p-type.

However, in the twenty-eighth embodiment, concentration of the electric field in a region ranging from the i-type silicon active layer $3i$ to the n-type emitter layer 4 can be effectively prevented by formation of the long field plate $14_L$ and the whole portion of the i-type silicon active layer $3i$ can be made of n type. If the i-type silicon active layer $3i$ can be held as an n-type region, formation of the MOSFET can be simplified.

Figure 44:
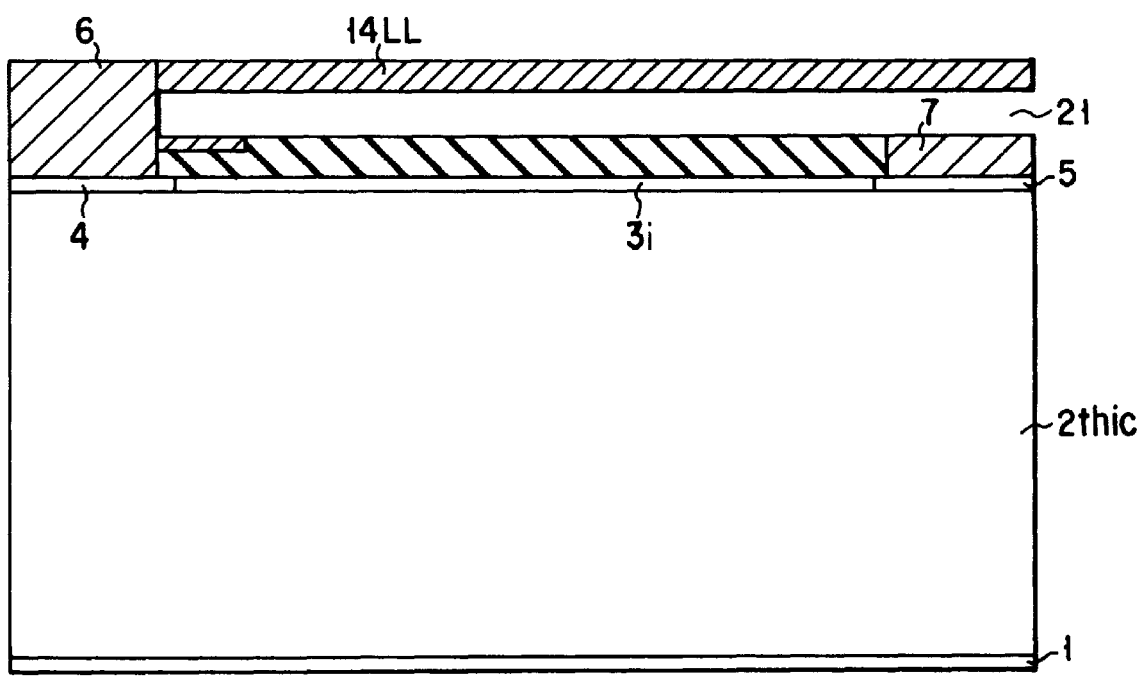
FIG. 44 is a cross sectional view showing the internal structure of a power semiconductor device (pin diode) according to a twenty-ninth embodiment of the present invention.

FIG. 44 is a cross sectional view showing the internal structure of a power semiconductor device (pin diode) according to a twenty-ninth embodiment of the present invention with a thick insulative film $2_{thic}$.

The power semiconductor device of the twenty-ninth embodiment is different from that of the twenty-eigth embodiment (FIG. 43) in that a longer field plate $14_{LL}$ is used. That is, in the twenty-ninth embodiment, the longer field plate $14_{LL}$ extending from the n-type emitter layer 4 to the p-type emitter layer 5 is used. By using the longer field plate $14_{LL}$, concentration of the electric field can be more effectively prevented and the i-type silicon active layer $3i$ can be more effectively held as an n-type region.

The present invention is not limited to the embodiments described above. For example, in the above embodiments, cases wherein the pin diode, MOSFET, IGBT (Insulated Gate Bipolar Transistor), and thyristor are used as the power semiconductor devices are explained, but the present invention can be effectively applied to another power semiconductor device such as a lateral IEGT (Injection Enhanced insulated Gate bipolar Transistor). Further, the present invention can be variously modified without departing from the technical scope thereof.

As described above, according to the present invention, the density of the electric field in the semiconductor film can be made low by using an insulative film having an uneven surface portion on the surface thereof (first aspect) or an insulative film having a charged electrode buried therein and set in an electrically floating state (second aspect), and the withstand voltage of the power semiconductor device can be increased in comparison with that of the conventional case.

Further, according to the present invention (third aspect), the withstand voltage of the power semiconductor device can be increased in comparison with that of the conventional case by forming the impurity concentration profile in the form of letter "S" even when a thick insulative film is used as an insulative film used for forming the substrate.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A power semiconductor device comprising:
a substrate;
a first insulative film formed on said substrate and having an uneven surface portion composed of a plurality of concave and convex portions on the surface thereof; and
an active layer formed on the uneven surface portion of said first insulative film;
wherein carriers moving in said active layer are trapped by said plurality of concave and convex portions of the uneven surface portion of said first insulative film, thereby causing an electric field in said active layer to be weaker than an electric field in said first insulative film, resulting in higher withstand voltage of said power semiconductor device.

2. A power semiconductor device according to claim 1, wherein the depth of each of said concave portions of said first insulative film is larger than 50 nm.

3. A power semiconductor device according to claim 1, wherein the lateral width of each of the concave portions of said first insulative film is smaller than three times the thickness measured from a top surface of each convex portion to a bottom surface of said first insulative film.

4. A power semiconductor device according to claim 3, wherein the lateral width of each of convex portions of said first insulative film is smaller than three times the thickness measured from a top surface of each convex portion to a bottom surface of said first insulative film.

5. A power semiconductor device according to claim 3, wherein the power semiconductor device is a pin diode.

6. A power semiconductor device according to claim 1, which further comprises a second insulative film formed on said active layer and having substantially the same shape as said first insulative film and in which carriers moving in said active layer are trapped by a plurality of concave and convex portions of the uneven surface portion of said second insulative film, wherein said concave portions of the second insulative film are in contact with said active layer.

7. A power semiconductor device according to claim 6, further comprising a field plate formed on said second insulative film, for alleviating intense electric field created in said active layer.

8. A power semiconductor device comprising:
a substrate;
an insulative film formed on said substrate and having a plurality of chargeable floating electrodes buried therein; and
an active layer formed on said insulative film;
wherein the distance between a top surface of each of said plurality of floating electrodes and a top surface of said insulative film is fixed such that carriers can be injected from said active layer into said plurality of floating electrodes by tunnel effect.

9. A power semiconductor device according to claim 8, wherein a distance from said active layer to said plurality of floating electrodes is larger than 5 nm and smaller than 200 nm.

10. A power semiconductor device according to claim 8, wherein the vertical width of each of said plurality of floating electrodes is smaller than half the thickness of said insulative film.

11. A power semiconductor device according to claim 8, wherein the lateral width of each of said plurality of floating electrodes is smaller than the lateral width of said active layer.

12. A power semiconductor device according to claim 11, wherein the interval between two of said plurality of floating electrodes is smaller than three times the thickness of said insulative film.

13. A power semiconductor device according to claim 11, wherein charges in said active layer are generated by avalanche phenomenon.

14. A power semiconductor device according to claim 11, wherein a distance from said active layer to said plurality of floating electrodes is smaller than 5 nm.

15. An insulative gate type bipolar transistor comprising:
a substrate;

an insulative film formed on said substrate and having a plurality of chargeable floating electrodes buried therein; and an active layer formed on said insulative film;

wherein the distance between a top surface of each of said plurality of floating electrodes and a top surface of said insulative film is fixed such that carriers can be injected from said active layer into said plurality of floating electrodes by tunnel effect.

16. A thyristor comprising:

a substrate;

an insulative film formed on said substrate and having a plurality of chargeable floating electrodes buried therein; and an active layer formed on said insulative film;

wherein the distance between a top surface of each of said plurality of floating electrodes and a top surface of said insulative film is fixed such that carriers can be injected from said active layer into said plurality of floating electrodes by tunnel effect.

17. A power semiconductor device comprising:

a substrate;

a first insulative film formed on said substrate; and an active layer formed on said first insulative film and having a drift region formed of a first conductivity type region and a second conductivity type region disposed adjacent to said first conductivity type region, said drift region extending between electrodes of said device;

wherein the concentration of the first conductivity type impurity in said first conductivity type region gradually decreases as a function of position in a drift length direction to a first position where a conductivity type of said drift region changes and the concentration of the second conductivity type impurity in the second conductivity type region gradually increases as a function of position in said drift length direction, and a gradient of said concentration in said second conductivity type region increases as a function of position in said drift length direction from said first position.

18. A power semiconductor device according to claim 17, wherein the thickness of said first insulative film is not smaller than the drift length of said active layer.

19. A power semiconductor device according to claim 17, wherein the thickness of said first insulative film is sufficiently larger than the thickness of said active layer.

20. A power semiconductor device according to claim 19, further comprising:

a second insulative film formed on said active layer; and a field plate formed on said second insulative film, for alleviating the intense electric field created in said active layer.

21. An MOS field effect transistor comprising:

a substrate;

an insulative film formed on said substrate; and an active layer formed on said insulative film and having a drift region formed of a first conductivity type region and a second conductivity type region disposed adjacent to said first conductivity type region, said drift region extending between electrodes of said device;

wherein the concentration of the first conductivity type impurity in said first conductivity type region gradually decreases as a function of position in a drift length direction to a first position where a conductivity type of said drift region changes and the concentration of the second conductivity type impurity in the second conductivity type region gradually increases as a function of position in said drift length direction, and a gradient of said concentration in said second conductivity type region increases as a function of position in said drift length direction from said first position.

22. A power semiconductor device comprising:

a substrate;

a first insulative film formed on said substrate and having an uneven surface portion composed of a plurality of concave and convex portions on the surface thereof, a depth of each concave portion of said first insulative film being substantially larger than 50 nm and a lateral width of each of said plurality of concave and convex portions being substantially smaller than three times the thickness measured from a top surface of each convex portion to a bottom surface of said first insulative film; and an active layer formed on the uneven surface portion of said first insulative film;

wherein carriers moving in said active layer are trapped by said plurality of concave and convex portions of the uneven surface portion of said first insulative film.

23. A power semiconductor device according to claim 22, wherein the trapping of the carriers causes an electric field in said active layer to be weaker than an electric field in said first insulative film, resulting in higher withstand voltage of said power semiconductor device.

24. A power semiconductor device comprising:

a substrate;

a first insulative film formed on said substrate and having an uneven surface portion composed of a plurality of concave and convex portions on the surface thereof;

an active layer formed on the uneven surface portion of said first insulative film; and first and second electrodes formed on said active layer;

wherein said plurality of concave and convex portions are arranged between said first and second electrodes and carriers moving in said active layer are trapped by said plurality of concave and convex portions of the uneven surface portion of said first insulative film.

25. A power semiconductor device according to claim 24, wherein the trapping of the carriers causes an electric field in said active layer to be weaker than an electric field in said first insulative film, resulting in higher withstand voltage of said power semiconductor device.

26. A power semiconductor device according to claim 24, wherein a depth of each concave portion of said first insulative film is substantially larger than 50 nm and a lateral width of each of said plurality of concave and convex portions is substantially smaller than three times the thickness measured from a top surface of each convex portion to a bottom surface of said first insulative film.

27. A power semiconductor device comprising:

a substrate;

a first insulative film formed on said substrate and having an uneven surface portion composed of a plurality of concave and convex portions on the surface thereof, a thickness measured from a bottom surface of each concave portion to a bottom surface of said first insulative film being smaller than a thickness measured from a top surface of each convex portion to the bottom surface of said first insulative film; and an active layer formed on the uneven surface portion of said first insulative film;

wherein carriers moving in said active layer are trapped by said plurality of concave and convex portions of the uneven surface portion of said first insulative film.

28. A power semiconductor device according to claim 27, wherein the bottom surface of said first insulative film is substantially flat.

29. A power semiconductor device according to claim 27, wherein the trapping of the carriers causes an electric field in said active layer to be weaker than an electric field in said first insulative film, resulting in higher withstand voltage of said power semiconductor device.

30. A power semiconductor device according to claim 27, wherein a depth of each concave portion of said first insulative film is substantially larger than 50 nm and a lateral width of each of said plurality of concave and convex portions is substantially smaller than three times the thickness measured from a top surface of each convex portion to a bottom surface of said first insulative film.

* * * * *